(12) United States Patent
Wang et al.

(10) Patent No.: US 12,317,717 B2
(45) Date of Patent: May 27, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Binyan Wang, Beijing (CN); Kaipeng Sun, Beijing (CN); Yue Long, Beijing (CN); Yudiao Cheng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 404 days.

(21) Appl. No.: 17/755,281

(22) PCT Filed: May 18, 2021

(86) PCT No.: PCT/CN2021/094378
§ 371 (c)(1),
(2) Date: Apr. 26, 2022

(87) PCT Pub. No.: WO2022/001434
PCT Pub. Date: Jan. 6, 2022

(65) Prior Publication Data
US 2022/0376003 A1 Nov. 24, 2022

(30) Foreign Application Priority Data

Jun. 30, 2020 (CN) .......................... 202010621890.3

(51) Int. Cl.
*H10K 59/35* (2023.01)
*H10K 59/121* (2023.01)
(Continued)

(52) U.S. Cl.
CPC ....... *H10K 59/353* (2023.02); *H10K 59/1213* (2023.02); *H10K 59/1216* (2023.02); *H10K 59/131* (2023.02); *H10K 59/65* (2023.02)

(58) Field of Classification Search
CPC ... H10K 59/353; H10K 59/131; H01L 27/124
See application file for complete search history.

(56) References Cited

U.S. PATENT DOCUMENTS 10,516,015 B2  12/2019  Xin et al.
11,367,851 B2  6/2022  Cai
(Continued)

FOREIGN PATENT DOCUMENTS

CN  107481669 A  12/2017
CN  108682392 A  10/2018
(Continued)

OTHER PUBLICATIONS

The Extended EESR dated Jul. 7, 2023; Appln No. 21833998.4.
(Continued)

*Primary Examiner* — Erik Kielin
(74) *Attorney, Agent, or Firm* — Frank Gao, Esq.

(57) ABSTRACT

A display panel and a display apparatus. The display panel comprises: a first display region (R1); a second display region (R2), which is at least located on one side of the first display region (R1); a plurality of sub-pixels, which are located in the first display region (R1) and the second display region (R2); a plurality of pixel groups (P1), which are located in the first display region (R1), at least one of the plurality of pixel groups (P1) comprising at least two sub-pixels; and a first power line (311), which is configured to supply a first voltage signal (ELVDD) to a pixel circuit, the first power line (311) comprising a plurality of first conducting wires (L1) and a plurality of second conducting wires (L2), with at least one of the plurality of first con-
(Continued)

ducting wires (L1) comprising a first sub-wiring (L111) extending in a first direction (D1) and a second sub-wiring (L112) extending in a second direction (D2), and the second sub-wiring (L112) being electrically connected to at least one of the plurality of second conducting wires (L2). By means of the display panel, the mesh structure of a first power line can be more stable, and the voltage drop on the first power line is reduced, such that the brightness uniformity of the display panel is better.

17 Claims, 18 Drawing Sheets

(51) Int. Cl.
*H10K 59/131* (2023.01)
*H10K 59/65* (2023.01)

(56) References Cited

U.S. PATENT DOCUMENTS

| | | | |
|---|---|---|---|
| 11,609,610 | B2 | 3/2023 | Ma et al. |
| 2016/0307938 | A1 | 10/2016 | Jin |
| 2020/0258452 | A1 | 8/2020 | Feng et al. |
| 2021/0183983 | A1* | 6/2021 | Bang .................... H10K 59/121 |
| 2021/0288215 | A1 | 9/2021 | Ma et al. |
| 2021/0313405 | A1 | 10/2021 | Xu et al. |
| 2021/0327358 | A1 | 10/2021 | Xiang et al. |
| 2022/0037428 | A1 | 2/2022 | Lou |
| 2023/0091142 | A1* | 3/2023 | Huang ................ H04M 1/0266 257/72 |

FOREIGN PATENT DOCUMENTS

| | | |
|---|---|---|
| CN | 108695371 A | 10/2018 |
| CN | 110649077 A | 1/2020 |
| CN | 110649085 A | 1/2020 |
| CN | 110767097 A | 2/2020 |
| CN | 110767662 A | 2/2020 |
| CN | 110854178 A | 2/2020 |
| CN | 111028765 A | 4/2020 |
| CN | 111146362 A | 5/2020 |
| CN | 210516000 U | 5/2020 |
| JP | 2020052394 A | 4/2020 |
| KR | 1020150097856 A | 8/2015 |

OTHER PUBLICATIONS

Indian Office Action dated Apr. 18, 2023; Appln. No. 202217032183.
The First Japanese Office Action mailed Apr. 1, 2025; Appln. No. 2022-532838.

\* cited by examiner

SCP

LY1

LY2

DISPLAY PANEL AND DISPLAY DEVICE

The present disclosure is a national stage entry of a PCT patent application No. PCT/CN2021/094378, filed May 18, 2021, which claims priority of Chinese Patent Application No. 202010621890.3 filed on Jun. 30, 2020, the disclosure of which is incorporated herein by reference in its entirety as part of the present disclosure.

TECHNICAL FIELD

At least one embodiment of the present disclosure relates to a display panel and a display device.

BACKGROUND

Based on the design of a camera under panel, a display panel generally includes a high Pixels Per Inch (PPI) region and a low PPI region, but generally, the display panel has a relatively low light transmittance in the low PPI region, which is not beneficial for improving the display effect of the camera in an imaging region.

SUMMARY

At least one embodiment of the present disclosure provides a display panel, the display panel comprises: a first display region; a second display region, at least located on a side of the first display region; a plurality of sub-pixels, located in the first display region and the second display region, a density of the sub-pixels in the first display region being less than a density of the sub-pixels in the second display region, and each of the plurality of the sub-pixel comprising a pixel circuit; a plurality of pixel groups, located in the first display region, at least one of the plurality of pixel groups comprising at least two sub-pixels; and a first power line, configured to provide a first voltage signal to the pixel circuit, the first power line comprises a plurality of first wires and a plurality of second wires, the plurality of first wires extend to the first display region from the second display region and are electrically connected with the plurality of pixel groups, the plurality of second wires are located in the first display region and located between the adjacent first wires, the plurality of second wires extend along a first direction, the adjacent second wires are spaced from each other along the first direction, and the plurality of second wires are electrically connected with the plurality of pixel group, and at least one of the plurality of first wires comprises a first sub-wire extending along the first direction and a second sub-wire extending along a second direction, the first direction intersects with the second direction, and the second sub-wire is electrically connected with at least one of the plurality of second wires.

For example, in the display panel provided by at least one embodiment of the present disclosure, the at least two sub-pixels comprise a first sub-pixel and a second sub-pixel, the first sub-pixel and the second sub-pixel are arranged along the first direction, at least one of the plurality of second wires is electrically connected with the first sub-pixel and the second sub-pixel, and the second sub-wire and the plurality of second wires are located in different layers.

For example, in the display panel provided by at least one embodiment of the present disclosure, the sub-pixel further comprises a light-emitting element, the pixel circuit comprises a first transistor, a second transistor, and a storage capacitor, the first transistor is respectively connected with the second transistor and the storage capacitor, the second transistor is connected with the light-emitting element, the first transistor comprises a first active part and a second active part, and the first active part and the second active part are connected by a conductive part.

For example, in the display panel provided by at least one embodiment of the present disclosure, the second wire further comprises a connecting arm, the connecting arm and the conductive part of one sub-pixel overlapping with the second wire in the pixel group are spaced from each other in a third direction and partially overlap in the third direction, and the third direction is perpendicular to the first direction and perpendicular to the second direction.

For example, in the display panel provided by at least one embodiment of the present disclosure, a shape of the connecting arm comprises a C shape.

For example, in the display panel provided by at least one embodiment of the present disclosure, the plurality of pixel groups comprise a plurality of first pixel groups and a plurality of second pixel groups arranged at intervals, and the adjacent first pixel group and second pixel group are connected through a plurality of lines.

For example, the display panel provided by at least one embodiment of the present disclosure further comprises a connecting wire, orthogonal projections of at least two of the plurality of lines between the adjacent first pixel group and second pixel group on a base substrate falling within an orthogonal projection of the connecting wire on the base substrate.

For example, in the display panel provided by at least one embodiment of the present disclosure, a plurality of gaps are formed between the plurality of lines, and an orthogonal projection of at least one of the plurality of gaps on the base substrate at least partially overlaps with the orthogonal projection of the connecting wire on the base substrate.

For example, in the display panel provided by at least one embodiment of the present disclosure, the pixel circuit comprises a first reset signal line, a second reset signal line, a gate line, a light-emitting control signal line, and an initialization signal line, to respectively provide a first reset signal, a second reset signal, a gate electrode scanning signal, a light-emitting control signal, and an initialization signal to the pixel circuit; and the plurality of lines are selected from at least two of the first reset signal line, the second reset signal line, the gate line, the light-emitting control signal line, the initialization signal line, and the first wire.

For example, in the display panel provided by at least one embodiment of the present disclosure, the connecting wire is provided with a block, and the block and the connecting wire are arranged in the same layer and integrally formed; the sub-pixel further comprises a light-emitting element, the pixel circuit includes a first transistor, a second transistor, and a storage capacitor, the first transistor is respectively connected with the second transistor and the storage capacitor, the second transistor is connected with the light-emitting element, the first transistor comprises a first active part and a second active part, and the first active part and the second active part are connected through a conductive part; and the block and the conductive part of one pixel unit overlapping with the first wire in the pixel group are spaced from each other in the third direction and partially overlap in the third direction.

For example, in the display panel provided by at least one embodiment of the present disclosure, the orthogonal projection of the connecting wire on the base substrate is at least partially located between orthogonal projections of the adjacent first pixel group and second pixel group on the base substrate.

For example, in the display panel provided by at least one embodiment of the present disclosure, a first reset signal line, a second reset signal line, a gate line, a light-emitting control signal line, an initialization signal line, and a second wire of the first pixel group are respectively connected with a first reset signal line, a second reset signal line, a gate line, a light-emitting control signal line, an initialization signal line, and a second wire of the second pixel group through the plurality of lines.

For example, in the display panel provided by at least one embodiment of the present disclosure, the connecting wire and the second wire are located in the same layer and integrally formed; or the connecting wire and the initialization signal line are located in the same layer and integrally formed; or the connecting wire and the first wire are located in the same layer.

For example, in the display panel provided by at least one embodiment of the present disclosure, the at least two sub-pixels further comprise a third sub-pixel and a fourth sub-pixel, the third sub-pixel and the fourth sub-pixel are arranged along the first direction and located on a side of the first sub-pixel and the second sub-pixel along the second direction, the third sub-pixel and the fourth sub-pixel are electrically connected with another one of the plurality of second wires, and the second sub-wire is electrically connected with at least one of the plurality of second wires.

For example, in the display panel provided by at least one embodiment of the present disclosure, the second sub-wire is provided with a block, the block and the second sub-wire are located in different layers and connected by a through hole, and the block and the conductive part of one pixel unit overlapping with the first wire in the pixel group are spaced from each other in the third direction and partially overlap in the third direction.

For example, in the display panel provided by at least one embodiment of the present disclosure, the first direction is perpendicular to the second direction.

For example, in the display panel provided by at least one embodiment of the present disclosure, the plurality of second wires are sequentially arranged along the first direction.

For example, in the display panel provided by at least one embodiment of the present disclosure, the adjacent second wires are not directly connected.

For example, in the display panel provided by at least one embodiment of the present disclosure, the first wire and the second wire are connected by a through hole penetrating through an insulating layer.

For example, in the display panel provided by at least one embodiment of the present disclosure, the first power line further comprises a third wire and a fourth wire, the third wire extends along the second direction, the third wire extends to the first display region from the second display region, and the second wire is electrically connected with the third wire; and the fourth wire extends along the second direction, the second wire is electrically connected with the fourth wire, and a length of the fourth wire in the second direction is less than or equal to a length of the third wire in the second direction.

For example, the display panel provided by at least one embodiment of the present disclosure comprises a plurality of fourth wires, the plurality of fourth wires being located between the adjacent third wires, the plurality of fourth wires being sequentially arranged along the second direction, and the adjacent fourth wires being spaced from each other in the second direction.

For example, in the display panel provided by at least one embodiment of the present disclosure, the first wire and the third wire are located in the same layer, and the fourth wire and the third wire are located in the same layer.

For example, in the display panel provided by at least one embodiment of the present disclosure, the first display region comprises a plurality of light-transmitting regions located between the adjacent pixel groups.

For example, in the display panel provided by at least one embodiment of the present disclosure, the plurality of pixel groups and the lines connected with the adjacent pixel groups surround the plurality of light-transmitting regions.

At least one embodiment of the present disclosure further provides a display device, the display device comprises the display panel provided by any embodiment of the present disclosure.

For example, the display panel provided by at least one embodiment of the present disclosure further comprises a sensor, the sensor is arranged on a side of the display panel, and an orthogonal projection of the sensor on the base substrate at least partially overlaps with the first display region.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the invention and thus are not limitative of the invention.

DETAILED DESCRIPTION

Figure 1A:
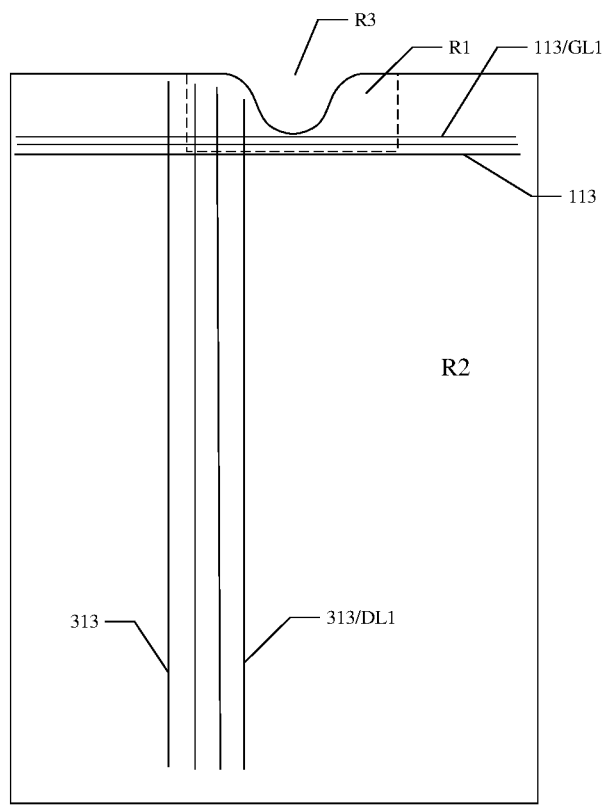
FIG. 1A to FIG. 1C are schematic diagrams of a display panel provided by some embodiments of the present disclosure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Due to people's love for selfie, a front camera hole has to exist, but the front camera hole and a sensor may occupy a portion of space, and at present, methods for placing the front camera hole include: a notch screen or a waterdrop screen is adopted; or an Active Area (AA) hole is adopted, i.e., the AA is performed a hole digging, and the camera and the sensor are integrally placed in the AA. However, such two methods both cannot meet the requirements of a full screen. Therefore, we select to adopt the camera under screen technology, the aperture ratio of the screen is improved through changing the Pixels Per Inch (PPI), and the camera is placed under the screen, so that the display completeness of the overall screen cannot be damaged.

In order to implement the frameless full screen design, the camera under screen technology has to be adopted, and it needs to improve the aperture ratio of a display panel. Therefore, on the premise of achieving the requirement above, how to arrange the structure of the display panel to ensure the display effect of the display panel becomes the problem which urgently needs to be solved.

At least one embodiment of the present disclosure provides a display panel, including: a first display region; a second display region, which is at least located on a side of the first display region; a plurality of sub-pixels, which are located in the first display region and the second display region, the density of the sub-pixels in the first display region being less than that of the sub-pixels in the second display region, and the sub-pixel including a pixel circuit; a plurality of pixel groups, which are located in the first display region, at least one of the plurality of pixel groups including at least two sub-pixels; and a first power line, which is configured to provide a first voltage signal to the pixel circuit. The first power line includes a plurality of first wires and a plurality of second wires, the plurality of first wires extend to the first display region from the second display region and are electrically connected with the plurality of pixel groups, the plurality of second wires are located in the first display region and located between the adjacent first wires, the plurality of second wires extend along a first direction, the adjacent second wires are spaced from each other along the first direction, and the plurality of second wires are electrically connected with the plurality of pixel groups; and at least one of the plurality of first wires includes a first sub-wire extending along the first direction and a second sub-wire extending along a second direction, the first direction intersects with the second direction, and the second sub-wire is electrically connected with at least one of the plurality of second wires.

The display panel provided by the embodiments of the present disclosure can make a net-shaped structure of the first power line more stable and reduce the voltage drop of the first power line, so as to make the brightness uniformity of the display panel better, thereby improving the display effect of a camera in an imaging region.

The embodiments of the present disclosure will be illustrated in detail below in combination with the drawings.

In a common display panel, no matter in a high PPI region or a low PPI region, the first power line always adopts the net-shaped structure. In order to make the net-shaped structure of the first power line more stable and reduce the voltage drop of the first power line so as to make the brightness uniformity of the display panel better, thereby improving the display effect of the camera in the imaging region, according to the display panel provided by the embodiments of the present disclosure, a signal line in the low PPI region is optimized, and for example, according to the embodiments of the present disclosure, wires of the net-shaped first power line, which are arranged transversely and longitudinally, are optimized.

Figure 1B:
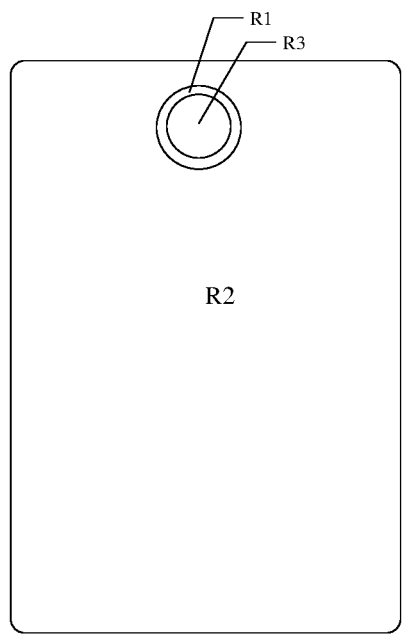
Figure 1C:
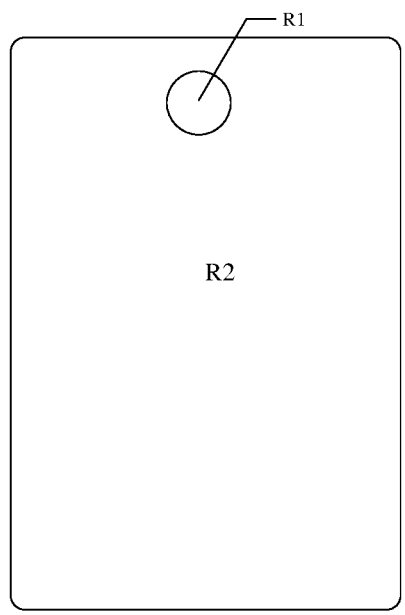

FIG. 1A to FIG. 1C are schematic diagrams of a display panel provided by some embodiments of the present disclosure. As shown in FIG. 1A to FIG. 1C, the display panel includes a first display region R1 and a second display region R2. The first display region R1 is a low PPI region, and the second display region R2 is a high PPI region. The first display region R1 is a partial light-transmitting region. As shown in FIG. 1A to FIG. 1C, the second display region R2 is at least located on a side of the first display region RE The display panel shown in FIG. 1A and FIG. 1B further includes a third region R3. A sensor, e.g., a camera, may be arranged in the first display region R1 (as shown in FIG. 1C), or arranged in the first display region R1 and the third region R3 (as shown in FIG. 1A and FIG. 1B). The third region R3 shown in FIG. 1A and FIG. 1B may be a perforated region, i.e., a material at the position corresponding to the third region R3 is removed to form a through hole. The sensor can receive ambient light. By taking a case that the sensor is the camera as an example, a camera under the screen is implemented, so that when a screen is normally used, the first display region corresponding to the sensor can normally display an image, and when the camera carries out shooting, the first display region can transmit the ambient light to support normal use. For example, the sensor is arranged on a non-display side of the display panel. The sensor may also be called as a member under screen.

FIG. 1A also shows a plurality of gate lines 113 and a plurality of data lines 313. The plurality of gate lines 113 include a first gate line GL1, and the plurality of data lines 313 include a first data line DL1. The first gate line GL1 extends to the first display region R1 from the second display region R2. The first data line DL1 extends to the second display region R2 from the first display region RE In the embodiments of the present disclosure, extension of a certain element from first display region R1 to the second display region R2 may be understood as a case that the element is located in the first display region R1 and the second display region R2, or may be regarded as extension of the certain element from the second display region R2 to the first display region RE For diagram clarity, FIG. 1A schematically shows several gate lines 113 and several data lines 313, and the numbers of the gate lines 113 and the data lines 313 may be determined as required. A plurality of gate lines 113 and a plurality of data lines 313 interact with each other and insulated from each other.

Figure 2:
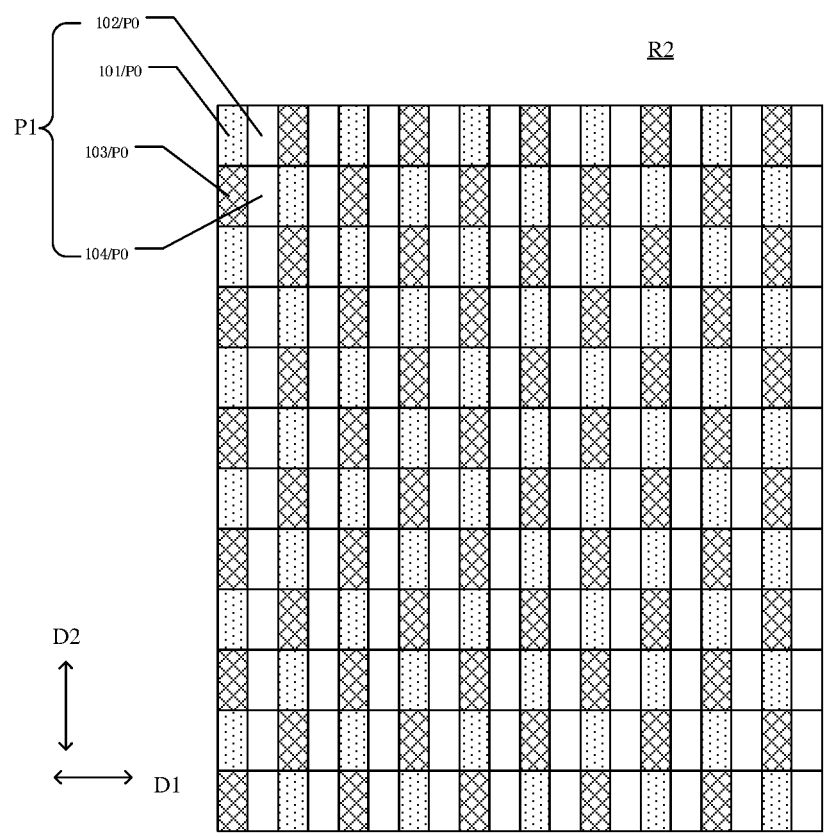
FIG. 2 is a schematic diagram of a second display region of a display panel provided by at least one embodiment of the present disclosure.
Figure 3:
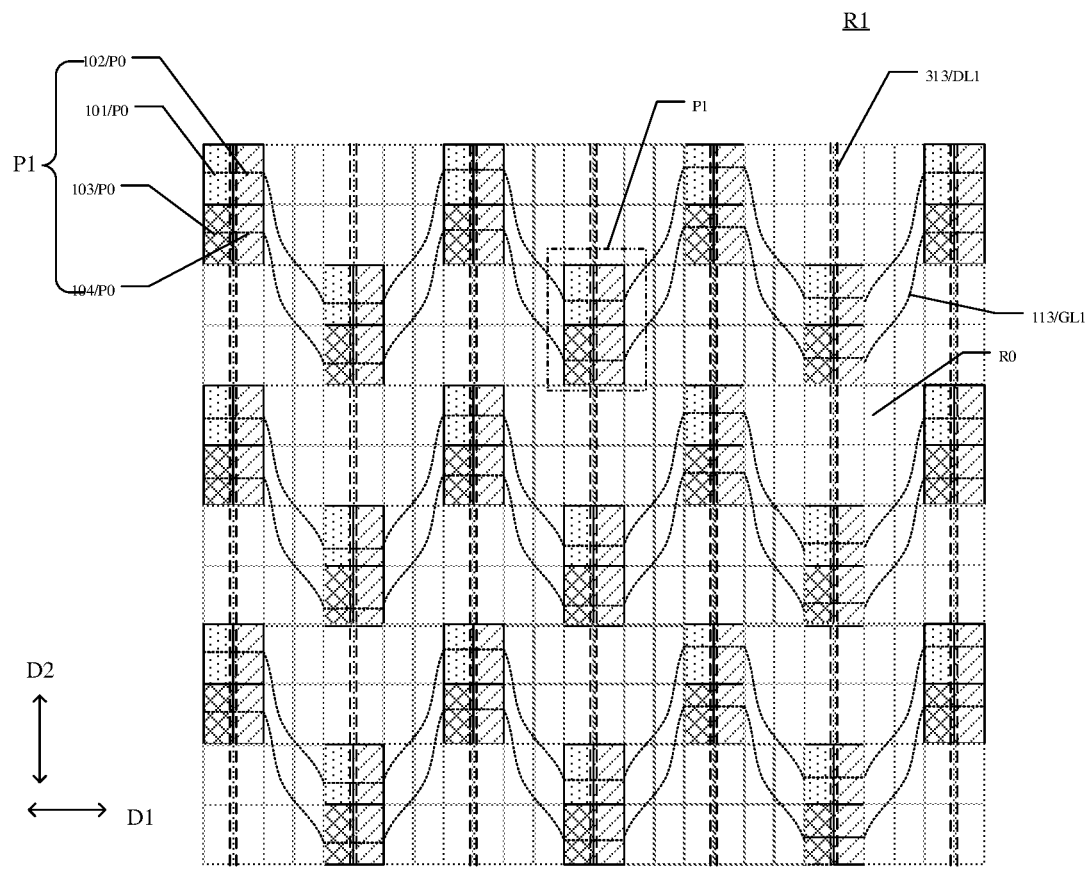
FIG. 3 is a schematic diagram of a first display region of a display panel provided by at least one embodiment of the present disclosure.
Figure 5:
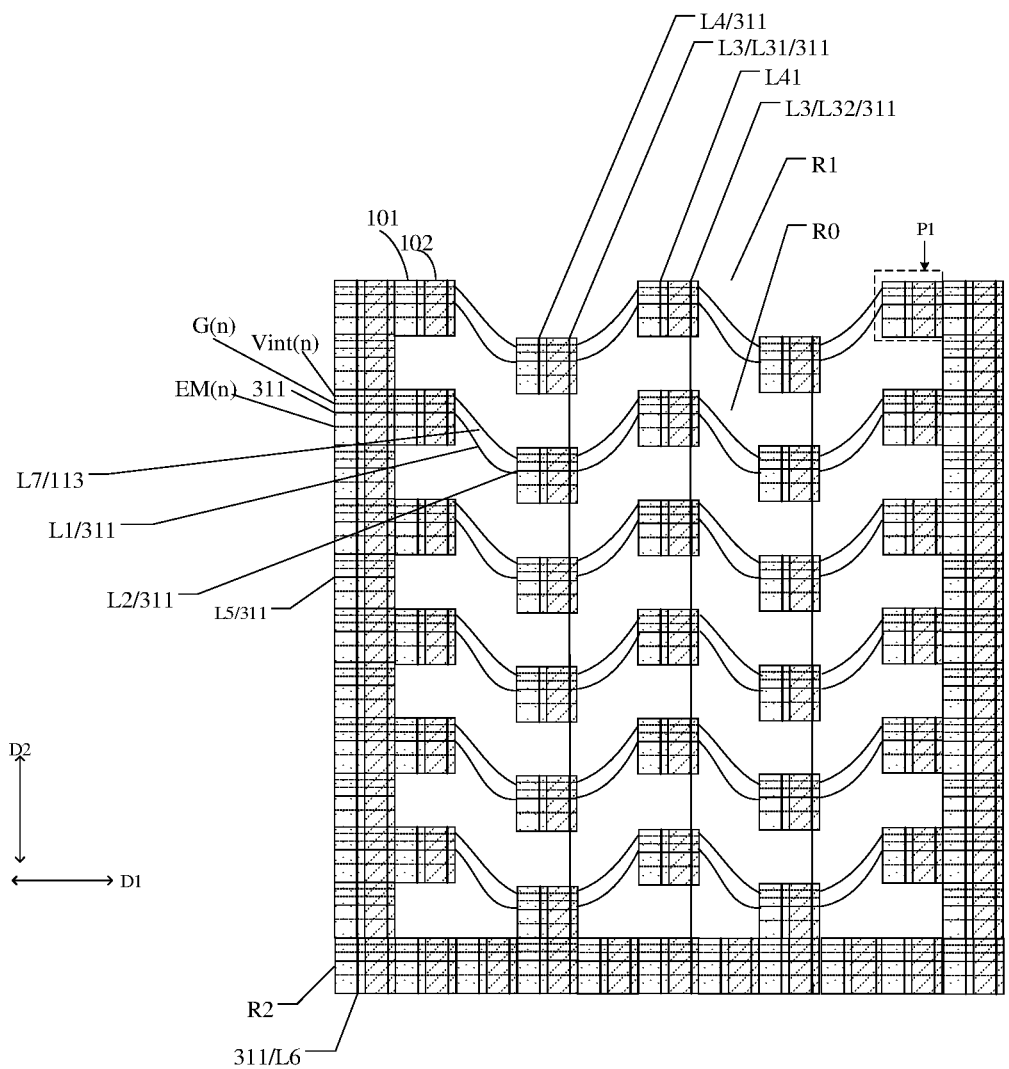
FIG. 5 is a schematic diagram of a display panel provided by at least one embodiment of the present disclosure.
Figure 18:
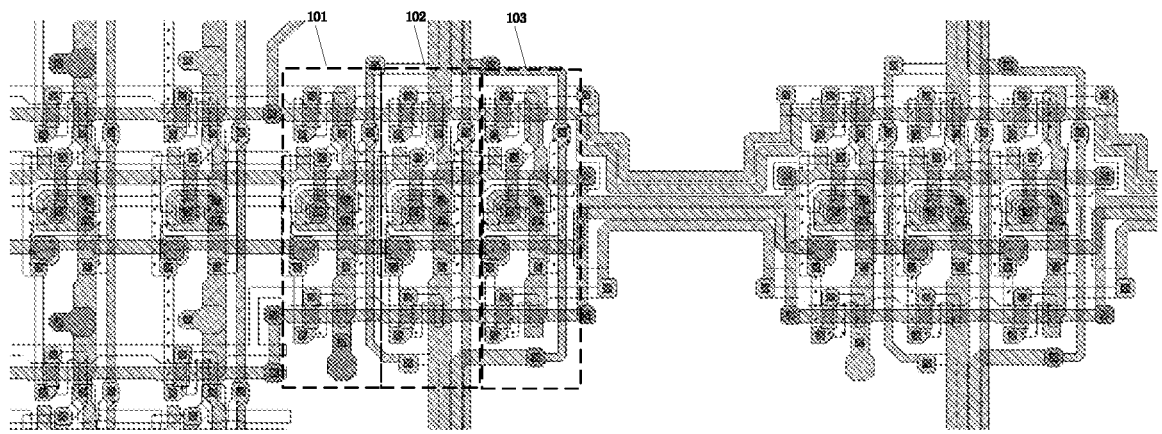
FIG. 18 is a schematic diagram of yet another display panel provided by at least one embodiment of the present disclosure.

FIG. 2 is a schematic diagram of a second display region of a display panel provided by at least one embodiment of the present disclosure. FIG. 3 is a schematic diagram of a first display region of a display panel provided by at least one embodiment of the present disclosure. As shown in FIG. 2 and FIG. 3, the display panel includes a plurality of sub-pixels P0, and the plurality of sub-pixels P0 include a first sub-pixel 101, a second sub-pixel 102, a third sub-pixel 103, and a fourth sub-pixel 104. For example, the display panel includes a plurality of pixel groups P1 located in the first display region R1, and at least one of the plurality of pixel groups P1 includes at least two sub-pixels. For example, in some examples, one pixel group P1 may include four sub-pixels, and for example, as shown in FIG. 3, one first sub-pixel 101, one second sub-pixel 102, one third sub-pixel 103, and one fourth sub-pixel 104 constitute one pixel group P1; for example, in some another examples, one pixel group P1 may include two sub-pixels, and for example, as shown in FIG. 5, one first sub-pixel 101 and one second sub-pixel 102 constitute one pixel group P1; and for example, one pixel group P1 may also include three sub-pixels (as shown in FIG. 18), and the embodiments of the present disclosure do not make any limit thereto. For example, one pixel group P1 is one repeat unit, and the pixel groups P1 are arranged in an array in the second display region R2. As shown in FIG. 3, in the first display region R1, one pixel group P1 is also called as one pixel island P1, which is the same in the embodiments below and is not repeated. The first display region R1 includes a plurality of light-transmitting regions R0; and the light-transmitting regions R0 are located between the adjacent pixel islands P1. The light-transmitting region R0 can transmit the ambient light. For example, the light-transmitting region R0 may include a base substrate and a transparent insulating layer located on the base substrate, and the light-transmitting region R0 is not provided with a light-shielding structure and for example, is not provided with a metal wire. For example, the light-transmitting region R0 is located in a region surrounded by four adjacent pixel islands P1, but the present disclosure is not limited thereto. For example, as shown in FIG. 3, the adjacent pixel islands P1 are arranged at intervals.

For example, the length of each of the plurality of light-transmitting regions R0 is substantially the same with that of one sub-pixel. For example, the pixel groups and the wires connected with the adjacent pixel groups surround the plurality of light-transmitting regions R0.

Figure 7:
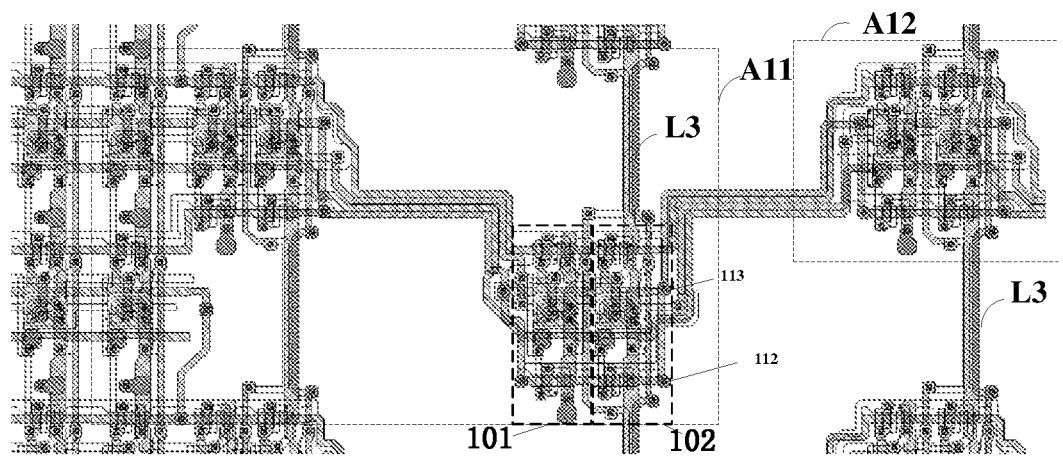
FIG. 7 is a schematic diagram of a display panel provided by at least one embodiment of the present disclosure.
Figure 12:
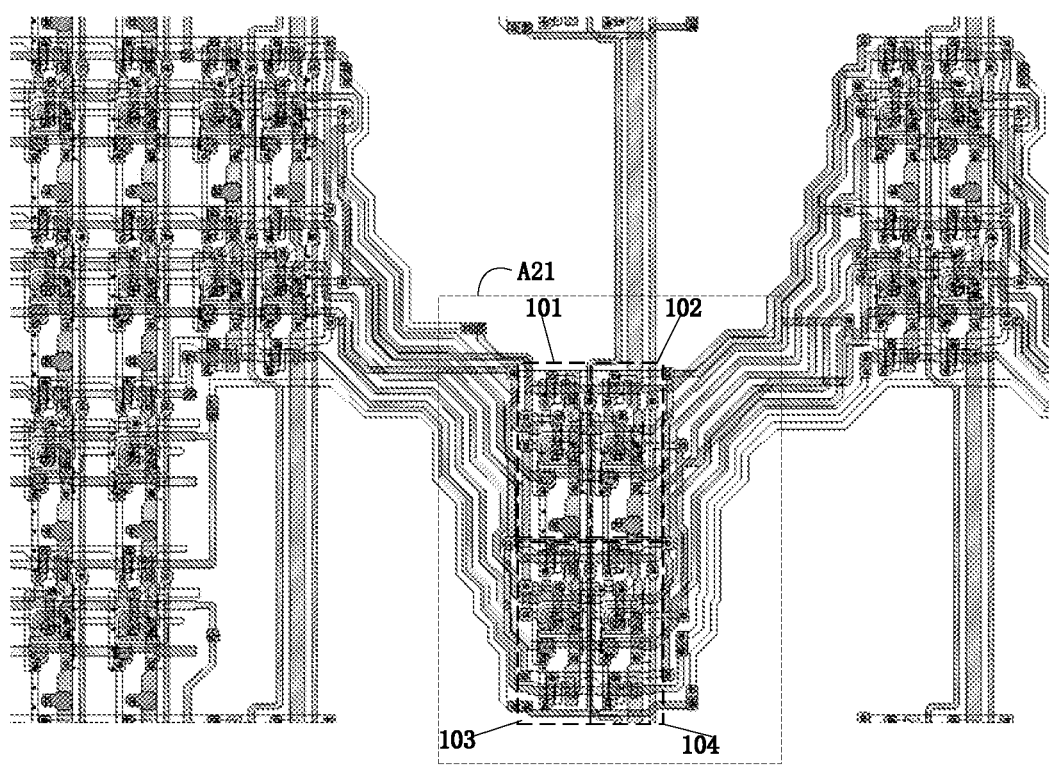
FIG. 12 is a plan view of another display panel provided by at least one embodiment of the present disclosure.

For example, in an example shown in FIG. 7, one pixel island may also include two sub-pixels and for example, include a first sub-pixel 101 and a second sub-pixel 102, and for example, the first sub-pixel 101 is a red sub-pixel and the second sub-pixel 102 is a green sub-pixel; for example, in an embodiment shown in FIG. 18, one pixel island P1 may also include three sub-pixels and for example, include a first sub-pixel 101, a second sub-pixel 102, and a third sub-pixel 103, for example, the first sub-pixel 101 is a red sub-pixel, the second sub-pixel 102 is a green sub-pixel, and the third sub-pixel is a blue sub-pixel, and for example, the three sub-pixels are located in one row; and for example, in an example shown in FIG. 12, one pixel island P1 may also include four sub-pixels and for example, include a first sub-pixel 101, a second sub-pixel 102, a third sub-pixel 103, and a fourth sub-pixel 104, for example, the first sub-pixel 101 is a red sub-pixel, the second sub-pixel 102 is a green sub-pixel, the third sub-pixel is a blue sub-pixel, and the fourth sub-pixel 104 is a green sub-pixel, and in other embodiments, the pixel group may also adopt other colors of pixel units. Certainly, in other embodiments, an arrangement mode of the plurality of sub-pixels P0 in the display panel is also limited to those shown in FIG. 2 and FIG. 3. The embodiments of the present disclosure do not make any limit thereto.

With reference to FIG. 2 and FIG. 3, the plurality of sub-pixels P0 are located in the first display region R1 and the second display region R2, the density of the pixel units in the first display region R1 is less than that of the pixel units in the second display region R2. Or, the density of the sub-pixels in the first display region R1 is less than that of the sub-pixels in the second display region R2. The density of the pixel units in the first display region R1 shown in FIG. 3 is a quarter of the density of the pixel units in the second display region R2. Namely, the density of the sub-pixels in the first display region R1 shown in FIG. 3 is a quarter of the density of the sub-pixels in the second display region R2. An arrangement mode of the light-transmitting regions R0 and the pixel units in the first display region R1 is not limited to that shown in FIG. 3, and may be set as required. For example, in other embodiments, the density of the sub-pixels in the first display region R1 is one second, one third, one sixth or one eighth, and the like of the density of the sub-pixels in the second display region R2, which is different from the value of one quarter, and the embodiments of the present disclosure do not make any limit thereto.

For example, as shown in FIG. 1A and FIG. 3, the display panel further includes the gate line 113 and the data line 313. The gate line 113 and the data line 313 are insulated from each other. Each gate line 113 is connected with one row of sub-pixels, and each data line 313 is connected with one column of sub-pixels. For example, the gate line 113 is configured to provide a scanning signal to one row of sub-pixels.

For example, as shown in FIG. 1A and FIG. 3, the data line 313 includes the first data line DL1. The first data line DL1 is at least located in the first display region R1. For example, the first data line DL1 extends to the second display region R2 from the first display region R1.

For example, as shown in FIG. 1A and FIG. 3, the gate line includes the first gate line GL1, and the first gate line GL1 extends to the first display region R1 from the second display region R2. As shown in FIG. 3, the light-transmitting region R0 is formed in a surrounding mode by two adjacent first gate lines GL1 and two adjacent first data lines DL1, but the present disclosure is not limited thereto.

Figure 4:
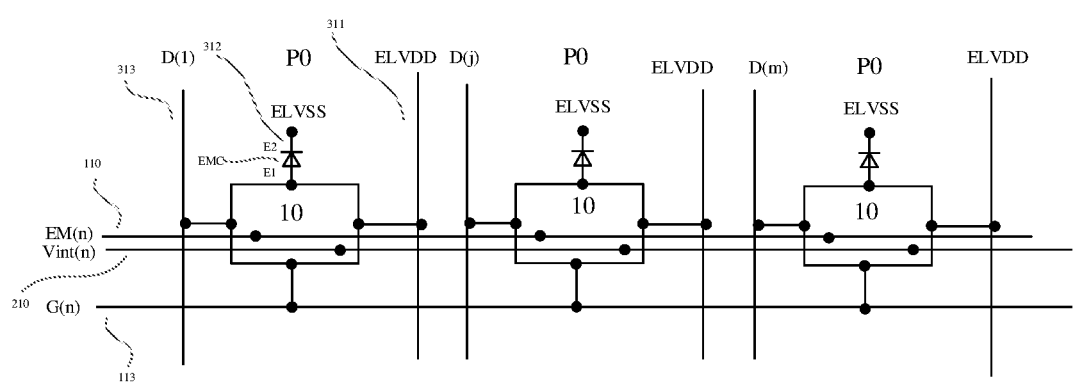
FIG. 4 is a schematic diagram of a sub-pixel and a signal line for providing a signal to the sub-pixel in a display panel provided by at least one embodiment of the present disclosure.

FIG. 4 is a schematic diagram of a sub-pixel and a signal line for providing a signal to the sub-pixel in a display panel provided by an embodiment of the present disclosure. As shown in FIG. 4, the display panel includes a plurality of sub-pixels P0, each sub-pixel P0 includes a light-emitting element EMC and a pixel circuit 10 for providing a driving current to the light-emitting element EMC, and the light-emitting element EMC may be an electroluminescent element, e.g., an organic electroluminescent element, and for example, may be an Organic Light-Emitting Diode (OLED).

As shown in FIG. 4, the display panel further includes an initialization signal line 210, a light-emitting control signal line 110, a data line 313, a first power line 311, and a second power line 312. For example, the gate line 113 is configured to provide a scanning signal SCAN to the pixel circuit 10. The light-emitting control signal line 110 is configured to provide a light-emitting control signal EM to the sub-pixel P0. The data line 313 is configured to provide a data signal DATA to the pixel circuit 10, the first power line 311 is configured to provide a constant first voltage signal ELVDD to the pixel circuit, the second power line 312 is configured to provide a constant second voltage signal ELVSS to the pixel circuit 10, and the first voltage signal ELVDD is greater than the second voltage signal ELVSS. The initialization signal line 210 is configured to provide an initialization signal Vint to the pixel circuit 10. The initialization signal Vint is a constant voltage signal, the magnitude of the initialization signal Vint, for example, may be between the first voltage signal ELVDD and the second voltage signal ELVSS, but the present disclosure is not limited thereto, and for example, the initialization signal Vint may be less than or equal to the second voltage signal ELVSS. For example, the pixel circuit 10 outputs a driving current under the control of signals such as the scanning signal SCAN, the data signal DATA, the initialization signal Vint, the first voltage signal ELVDD, the second voltage signal ELVSS, the light-emitting control signal EM, and the like so as to drive the light-emitting element EMC to emit light. As shown in FIG. 4, the light-emitting element EMC includes a pixel electrode E1 and a common electrode E2. The pixel electrode E1 is connected with the pixel circuit 10, and the common electrode E2 is connected with the second power line 312.

FIG. 5 is a schematic diagram of a display panel provided by some embodiments of the present disclosure. It should be noted that illustration is carried out in FIG. 5 by taking a case that one pixel island P1 includes two sub-pixels as an example, each pixel island P1 may also include three or four sub-pixels, the specific connection relationship of the three or four sub-pixels is similar with that of two sub-pixels and is not repeated herein, and the embodiments of the present disclosure do not make any limit thereto.

As shown in FIG. 5, the first power line 311 includes a plurality of first wires L1 and a plurality of second wires L2. For example, the first power line 311 may also include a plurality of third wires L3. For example, the first wire L1 extends to the first display region R1 from the second display region R2, and is electrically connected with a plurality of pixel groups (i.e., pixel islands) P1. The plurality of second wires L2 are located in the first display region R1 and located between the adjacent first wires L1, each second wire L2 extends along the first direction D1, and the plurality of second wires L2 are electrically connected with the plurality of pixel groups P1. For example, the third wire L3 is at least located in the first display region R1, for example, the third wire L3 extends to the first display region R1 from the second display region R2, the third wire extends along the second direction D2, the first direction D1 intersects with the second direction D2, the adjacent second wires L2 are spaced from each other along the first direction D1, and the adjacent second wires L2 are connected through the first wire L1 and are connected with the third wire L3 to receive the first voltage signal ELVDD. For example, the first direction D1 is perpendicular to the second direction D2, but the present disclosure is not limited thereto. For example, the first wire L1 extends along the first direction D1. For example, in the embodiments of the present disclosure, the second wire L2 is merely located in the first display region RE In the embodiments of the present disclosure, an element extending along a certain direction is not necessarily of a straight line shape and may also have a curve line or broken line portion, for example, the extension direction of a certain element refers to the rough extension trend of the element, and for example, each portion of the element does not necessarily extend along this direction.

For example, as shown in FIG. 5, the first wires L1 and the second wires L2 are respectively connected with the sub-pixels in the two adjacent pixel islands P1, which are located in the corresponding rows, but the present disclosure is not limited thereto, and in other embodiments, the pixel island P1 may also include two or more rows of sub-pixels. For example, as shown in FIG. 6A to FIG. 6E, the pixel island P1 at least includes one row of two pixel units, the second wire L2 overlaps with the one row of two pixel units. For example, as shown in FIG. 5, the first wire L1 is located between the two adjacent pixel islands P1, and the second wire L2 respectively overlapping with the two adjacent pixel islands P1 is connected through the first wire L1.

For example, as shown in FIG. 5, a plurality of second wires L2 are sequentially arranged along the first direction DE For example, as shown in FIG. 5, the adjacent second wires L2 are not directly connected, for example, are connected in a jumper mode, i.e., are connected through the first wires L1 located in different layers, so that the net-shaped structure of the first power line is more stable and the voltage drop of the first power line is reduced, thereby making the brightness uniformity of the display panel better. Certainly, the adjacent second wires L2 may also be directly connected, and the embodiments of the present disclosure do not make any limit thereto.

For example, as shown in FIG. 5, in order to improve the light transmittance of the first display region, the length of a portion of the first wire L1, which is located in the first display region R1, in the first direction D1 is greater than that of the second wire L2 in the first direction D1.

For example, as shown in FIG. 5, the first power line 311 further includes a fourth wire L4, the fourth wire L4 extends along the second direction D2, the second wire L2 is connected with the fourth wire L4 to receive the first voltage signal ELVDD, and the length of the fourth wire L4 in the second direction D2 is less than or equal to that of the three conductor L3 in the second direction D2. In the display panel shown in FIG. 5, the length of the fourth wire L4 in the second direction D2 is less than that of the three conductor L3 in the second direction D2.

For example, as shown in FIG. 5, in order to further improve the light transmittance of the first display region, a plurality of fourth wires L4 are provided, the plurality of fourth wires L4 are sequentially arranged along the second direction D2, and the adjacent fourth wires L4 are spaced from each other in the second direction D2. For example, as shown in FIG. 5, the plurality of fourth wires L4 are located between a third wire L31 and a third wire L32, and the third wire L31 and the third wire L32 are the adjacent third wires L3. FIG. 5 shows five fourth wires L41, but the number of the fourth wires L4 located between the adjacent third wires L3 is not limited to that shown in the drawing and may be determined as required. A plurality of fourth wires L4 are spaced from each other in the second direction D2 and equivalently, portions of some of first power lines arranged along the second direction in a common display panel are removed, so that wiring is reduced, the wire space is optimized, and the light transmittance is improved.

For example, as shown in FIG. 5, the first power line 311 further includes a fifth wire L5, the fifth wire L5 extends along the first direction D1, the fifth wire L5 is located in the second display region R2, and the fifth wire L5 and the second wire L2 adjacent to the fifth wire L5 are spaced from each other along the first direction D1. Therefore, at the junction position of the first display region and the second display region, wiring is reduced and the light transmittance is improved.

In the embodiments of the present disclosure, the number of the pixel units included by each pixel island and an arrangement mode of the pixel units are not limited.

As shown in FIG. 5, in the display panel, the first power line 311 further includes a plurality of sixth wires L6, the sixth wires L6 are located in the second display region R2, and the sixth wires L6 extend along the second direction D2. In the second display region R2, the plurality of fifth conductors L5 and the plurality of sixth wires L6 interact with each other. In the embodiments of the present disclosure, both the fifth wires L5 and the sixth wires L6 are merely located in the second display region R2.

As shown in FIG. 5, the same gate line 113 connects the sub-pixels in the second display region, which are located on both sides of the first display region R1, and the sub-pixels located in the first display region R1 to form one row of sub-pixels. The embodiments of the present disclosure do not make any limit to the form of the first wire, as long as the first wire can extend to the first display region R1 from the second display region R2. The first power line in FIG. 5 also may be replaced with the first power lines in other embodiments of the present disclosure. In addition, the extension mode of the gate line 113 is not limited to that shown in FIG. 5, as long as the arrangement mode of the gate line 113 can enable the pixels in the second display region R2 and the pixels in the first display region R1 to be connected. For example, in the first display region R1, the gate lines of the corresponding rows of sub-pixels between two adjacent pixel islands are connected through seventh wires L7 (i.e., in a jumper mode), certainly, the gate lines of the corresponding rows of sub-pixels between two adjacent pixel islands may also be directly connected, and the embodiments of the present disclosure do not make any limit thereto.

For example, a corresponding relationship between the rest of signal lines (e.g., the initialization signal line for providing the initialization signal Vint and the light-emitting control signal line for providing the light-emitting control signal EM) and one pixel island P1 is as shown in FIG. 5, the embodiments of the present disclosure do not make any limit thereto, and the corresponding relationship is not repeated herein.

For example, in the display panel shown in FIG. 5, the first wire is in contact with two adjacent second wires for example by a through hole passing through the insulating layer.

For example, in the embodiments of the present disclosure, one row of sub-pixels are sub-pixels connected to the same gate line 113, while one row of sub-pixels are sub-pixels connected to the same data line 313. In the embodiments of the present disclosure, illustration is carried out by taking a case that the first wire L1, the second wire L2, and the fifth wire L5 all extend along a row direction (i.e., the first direction D1) and the third wire L3, the fourth wire L4, and the sixth wire L6 extend along a column direction (i.e., the second direction D2) as an example, but the present disclosure is not limited thereto. In other embodiments, it may also be that the first wire L1, the second wire L2, and the fifth wire L5 all extend along the column direction, the third wire L3, the fourth wire L4, and the sixth wire L6 extend along the row direction, and correspondingly, the second direction D2 and the first direction D1 also may be replaced with each other.

FIG. 5 takes a case that the pixel island includes two sub-pixels (e.g., one row of sub-pixels) as an example, in other embodiments, the pixel island may also include three or more sub-pixels (e.g., two rows of sub-pixels), and in this case, the plurality of second wires may be understood as the second wires connected with the same row of sub-pixels in one pixel island. In the case that the first wire L1, the second wire L2, and the fifth wire L5 all extend along the column direction and the third wire L3, the fourth wire L4, and the sixth wire L6 extend along the row direction, the plurality of second wires may be understood as the second wires connected with the same column of sub-pixels in one pixel island.

Some embodiments of the present disclosure will be described below in combination with FIG. 6A to FIG. 24. FIG. 6A to FIG. 24 illustrate by taking a 7T1C pixel circuit as an example.

Figure 6A:
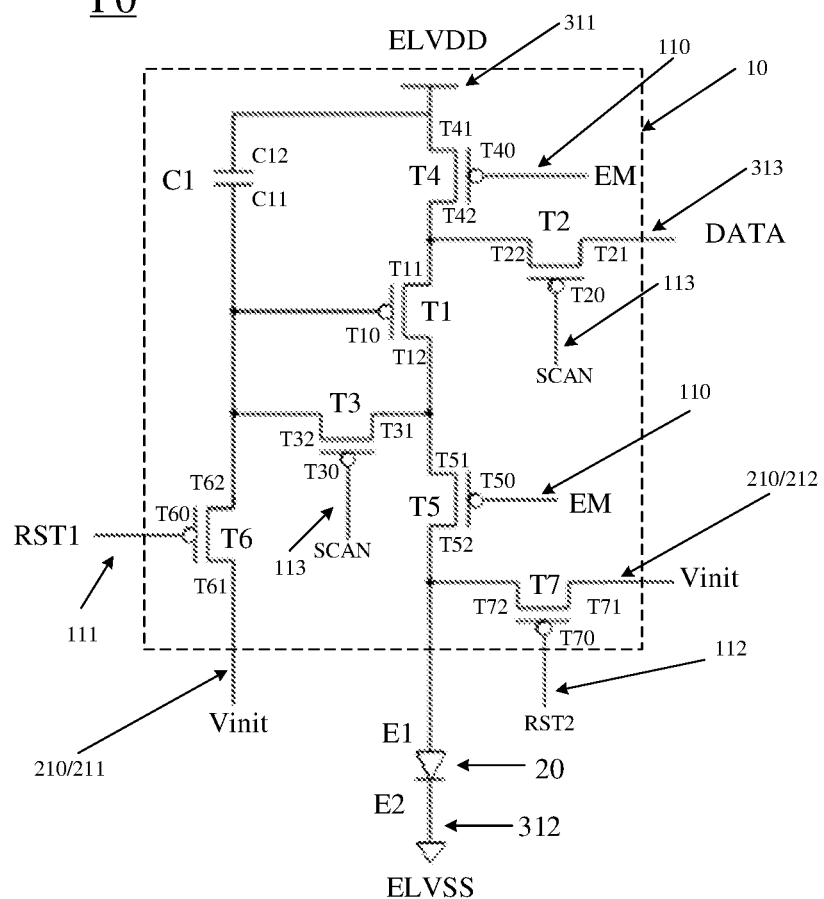
FIG. 6A to FIG. 6F are diagrams of a pixel circuit and a laminated structure thereof provided by some embodiments of the present disclosure.
Figure 6B:
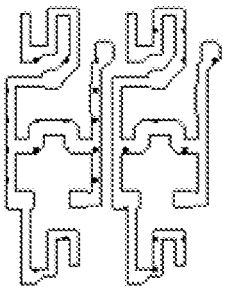
Figure 6C:
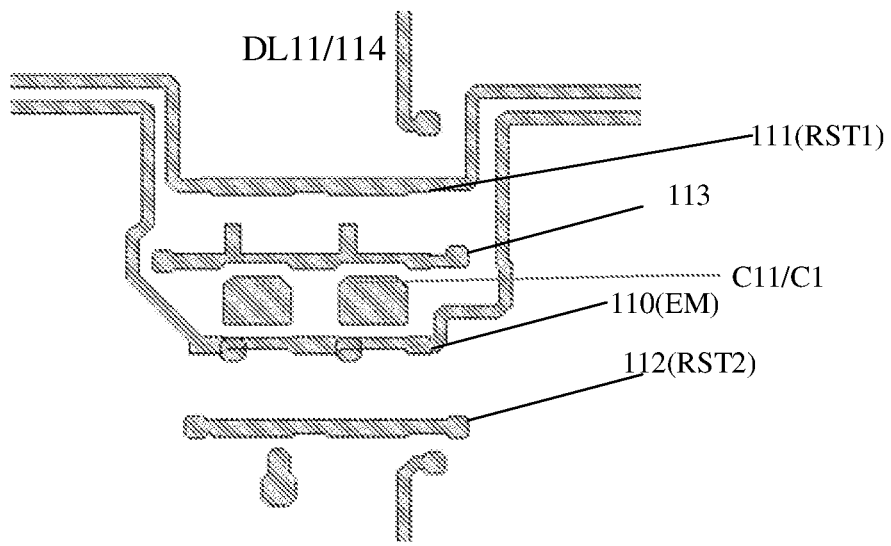
Figure 6D:
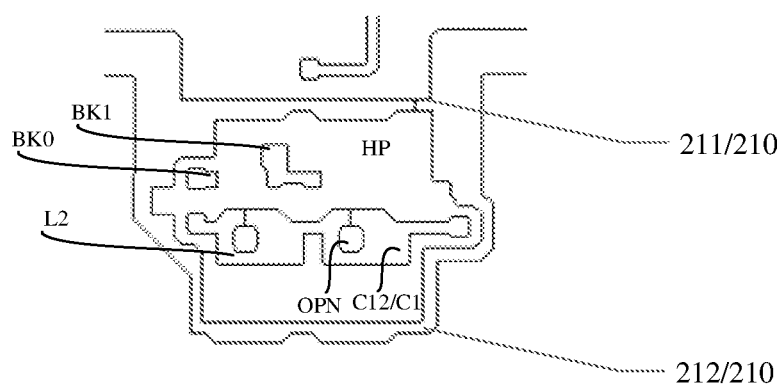
Figure 23:
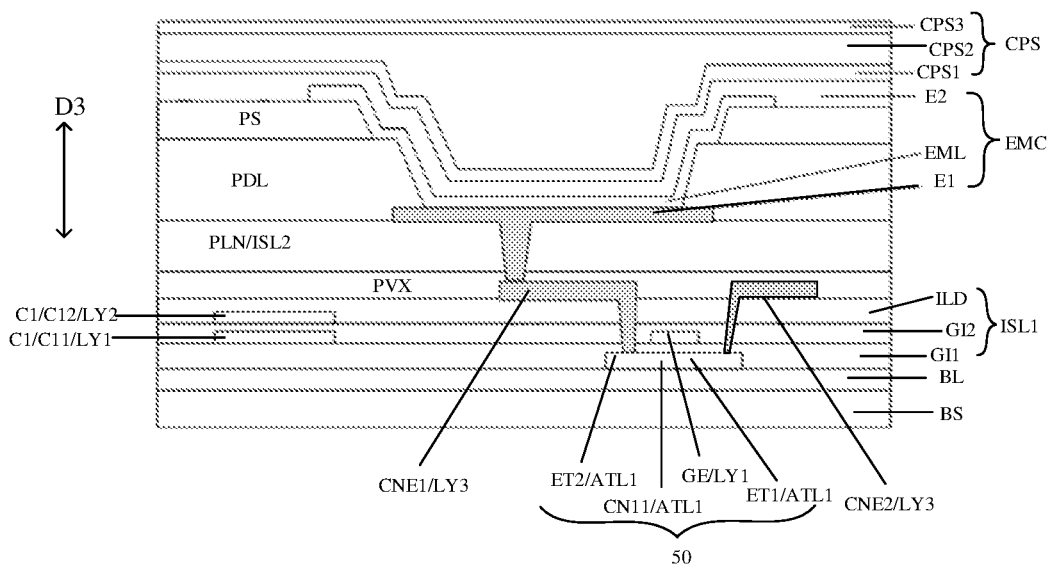
FIG. 23 is a cross-sectional schematic diagram of a pixel circuit of a display panel provided by at least one embodiment of the present disclosure.
Figure 24:
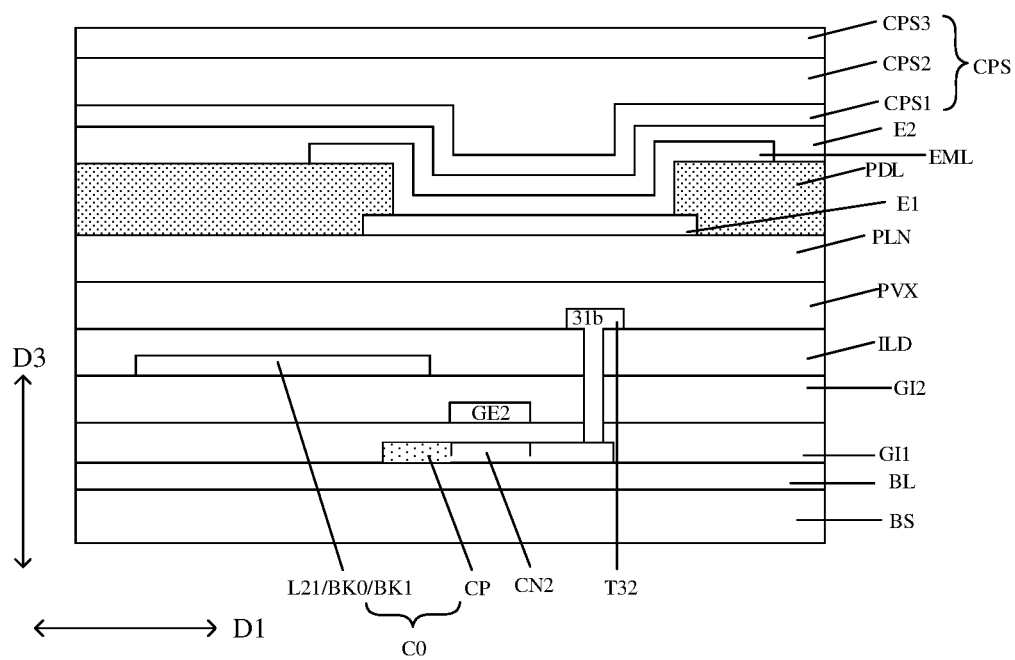
FIG. 24 is a cross-sectional schematic diagram of a display panel provided by at least one embodiment of the present disclosure.

FIG. 6A is a schematic diagram of a pixel circuit of a display panel provided by an embodiment of the present disclosure. FIG. 6B is a plan view of a semiconductor pattern in a display panel provided by an embodiment of the present disclosure. FIG. 6C is a plan view of a first conductive pattern layer in a display panel provided by an embodiment of the present disclosure. FIG. 6D is a plan view of a second conductive pattern layer in a display panel provided by an embodiment of the present disclosure. FIG. 23 is a cross-sectional schematic diagram of a display panel provided by an embodiment of the present disclosure. FIG. 24 is a cross-sectional schematic diagram of a display panel provided by an embodiment of the present disclosure. In the embodiment, for illustration clarity, in the plan views, the insulating layer is shown in a form of the through hole, and the insulating layer adopts transparentizing processing.

Figure 6E:
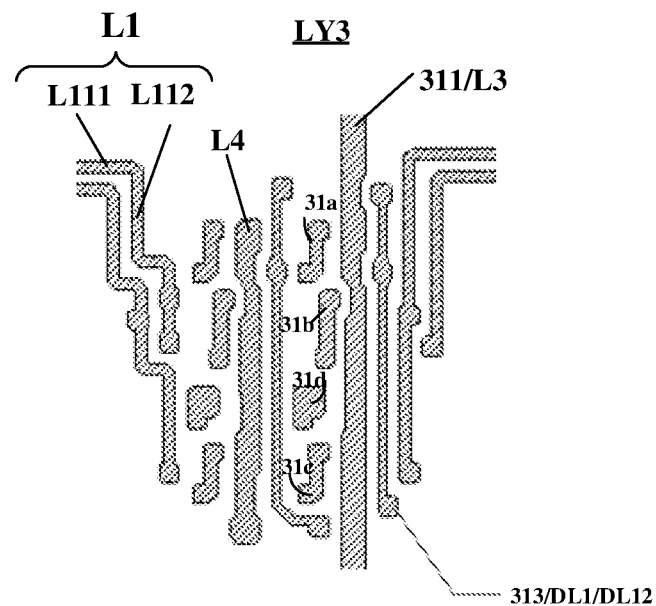
Figure 6F:
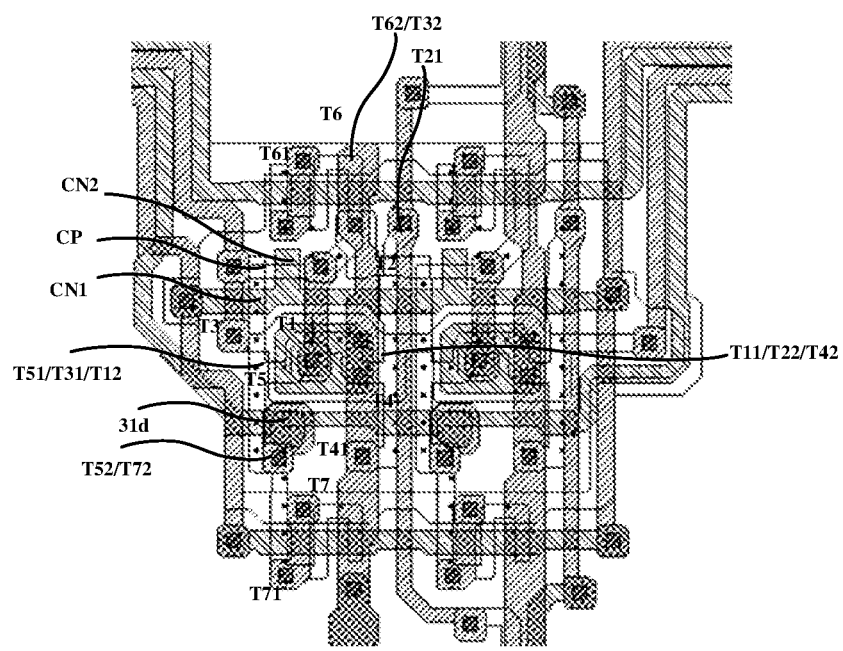

It should be noted that FIG. 6B to FIG. 6F respectively show layered structure views of the pixel circuit including two sub-pixels. It should be noted that more or fewer sub-pixels may also be included, the structure of the pixel circuit may be designed by adopting a layout of one of the pixels shown in FIG. 6B to FIG. 6F, and the embodiments of the present disclosure do not make any limit thereto. For example, FIG. 6F illustrates by taking a pixel structure of the first sub-pixel 101 as an example, and pixel structures of the rest of sub-pixels, e.g., the second sub-pixel, the third sub-pixel, and the fourth sub-pixel, are similar with it and are not repeated herein.

For example, with reference to FIG. 6A, the gate line 113 is configured to provide the scanning signal SCAN to the pixel circuit 10. The light-emitting control signal line 110 is configured to provide the light-emitting control signal EM to the sub-pixel P0. The data line 313 is configured to provide the data signal DATA to the pixel circuit 10, the first power line 311 is configured to provide the constant first voltage signal ELVDD to the pixel circuit 10, the second power line 312 is configured to provide the constant second voltage signal ELVSS to the pixel circuit 10, and the first voltage signal ELVDD is greater than the second voltage signal ELVSS. The initialization signal line 210 is configured to provide the initialization signal Vint to the pixel circuit 10. The initialization signal Vint is the constant voltage signal, the magnitude of the initialization signal Vint, for example, may be between the first voltage signal ELVDD and the second voltage signal ELVSS, but the present disclosure is not limited thereto, and for example, the initialization signal Vint may be less than or equal to the second voltage signal ELVSS. For example, the pixel circuit 10 outputs the driving current under the control of the scanning signal SCAN, the data signal DATA, the initialization signal Vint, the first voltage signal ELVDD, the second voltage signal ELVSS, the light-emitting control signal EM, and the like so as to drive the light-emitting element 20 to emit light. The light-emitting element 20 emit red light, blue light, green light, or white light, and the like under the drive of the corresponding pixel circuit 10.

As shown in FIG. 6A, the pixel circuit 10 includes a driving transistor T1, a data writing transistor T2, a threshold compensation transistor T3, a first light-emitting control transistor T4, a second light-emitting control transistor T5, a first reset transistor T6, a second reset transistor T7, and a storage capacitor C1. The driving transistor T1 is electrically connected with the light-emitting element 20, and outputs the driving current under the control of the scanning signal SCAN, the data signal DATA, the first voltage signal ELVDD, the second voltage signal ELVSS, and the like to drive the light-emitting element 20 to emit light.

For example, a display panel provided by an embodiment of the present disclosure further includes: a data driving circuit and a scanning driving circuit. The data driving circuit is configured to provide the data signal DATA to the sub-pixel P0 according to an instruction of a control circuit; and the scanning driving circuit is configured to provide a signal such as the light-emitting control signal EM, the scanning signal SCAN, a first reset control signal RST1, a second reset signal RST2, and the like to the sub-pixel P0 according to an instruction of the control circuit. For example, the control circuit includes an external Integrated Circuit (IC), but the present disclosure is not limited thereto. For example, the scanning driving circuit is a Gate Driver On Array (GOA) structure mounted on the display panel, or is a driving chip (IC) structure bonded to the display panel. For example, different driving circuits may also be adopted to respectively provide the light-emitting control signal EM and the scanning signal SCAN. For example, the display panel further includes a power source (not shown in the figure) to provide the above voltage signal, the power source may be a voltage source or a current source as required, and the power source is configured to respectively provide the first voltage signal ELVDD, the second voltage signal ELVSS, the initialization signal Vint, and the like to the sub-pixel P0 through the first power line 311, the second power line 312, and the initialization signal line 210.

As shown in FIG. 6A, a second electrode C12 of the storage capacitor C1 is electrically connected with the first power line 311, and a first electrode C11 of the storage capacitor C1 is electrically connected with a second electrode T32 of the threshold compensation transistor T3. A gate electrode T20 of the data writing transistor T2 is electrically connected with the gate line 113, and a first electrode T21 and a second electrode T22 of the data writing transistor T2 are respectively and electrically connected with the data line 313 and a first electrode T11 of the driving transistor T1. A gate electrode T30 of the threshold compensation transistor T3 is electrically connected with the gate line 113, a first electrode T31 of the threshold compensation transistor T3 is electrically connected with a second electrode T12 of the driving transistor T1, and the second electrode T32 of the threshold compensation transistor T3 is electrically connected with a gate electrode T10 of the driving transistor T1.

For example, as shown in FIG. 6A, a gate electrode T40 of the first light-emitting control transistor T4 and a gate electrode T50 of the second light-emitting control transistor T5 are both connected with the light-emitting control signal line 110.

For example, as shown in FIG. 6A, a first electrode T41 and a second electrode T42 of the first light-emitting control transistor T4 are respectively and electrically connected with the first power line 311 and the first electrode T11 of the driving transistor T1. A first electrode T51 and a second electrode T52 of the second light-emitting control transistor T5 are respectively and electrically connected with the second electrode T12 of the driving transistor T1 and the pixel electrode E1 (which may be an anode of an OLED) of the light-emitting element 20. The common electrode E2 (which may be a common electrode of the OLED, e.g., a cathode) of the light-emitting element 20 is electrically connected with the second power line 312.

For example, as shown in FIG. 6A, a gate electrode T60 of the first reset transistor T6 is electrically connected with a first reset control signal line 111, a first electrode T61 of the first reset transistor T6 is electrically connected with the initialization signal line 210 (a first initialization signal line 211), and a second electrode T62 of the first reset transistor T6 is electrically connected with the gate electrode T10 of the driving transistor T1. A gate electrode T70 of the second reset transistor T7 is electrically connected with a second reset control signal line 112, a first electrode T71 of the second reset transistor T7 is electrically connected with the initialization signal line 210 (a second initialization signal line 212), and a second electrode T72 of the second reset transistor T7 is electrically connected with the pixel electrode E1 of the light-emitting element 20.

FIG. 6B shows a semiconductor pattern SCP, FIG. 6C shows the first conductive pattern layer LY1, and a first gate insulating layer is arranged between the first conductive pattern layer LY1 and the semiconductor pattern SCP. The semiconductor pattern SCP is doped by taking the first conductive pattern layer LY1 as a mask, so that the semiconductor characteristic is reserved in a region of the semiconductor pattern SCP, which is not covered by the first conductive pattern layer LY1, a channel of a thin film transistor is formed, a region of the semiconductor pattern SCP, which is covered by the first conductive pattern layer LY1, is subjected to conductor treatment, and a source electrode or a drain electrode of the thin film transistor is formed. FIG. 6A shows an active layer ALT formed after the semiconductor pattern SCP is partially subjected to conductor treatment.

As shown in FIG. 6C, the first conductive pattern layer LY1 includes the first reset control signal line 111, the second reset control signal line 112, the light-emitting control signal line 110, the gate line 113, and the first electrode C11 of the storage capacitor C1. FIG. 6C further shows a first portion DL11 (a wire 114) of the first data line DLL For example, with reference to FIG. 7, in the embodiments of the present disclosure, a current row of gate line 113 is also connected with the second reset control signal line 112 located in the same row.

FIG. 6D shows a second conducive pattern layer LY2, and a second gate insulating layer is arranged between the second conductive pattern layer LY2 and the first conductive pattern layer LY1. The second conductive pattern layer LY2 includes a block BK0, a block BK1, the initialization signal line 210 and the second electrode C12 of the storage capacitor C1. The second electrodes C12 of the storage capacitors C1 of two sub-pixels of one pixel island are integrally formed to serve as the second wire L2. The second electrode C12 of the storage capacitor C1 has an opening OPN. An interlayer insulating layer is located between the second conductive pattern layer LY2 and the third conductive pattern layer LY3. What is related to the first gate insulating layer, the second gate insulating layer, the interlayer insulating layer, the first conductive pattern layer LY1, the second conductive pattern layer LY2, and a third conductive pattern layer LY3 may refer to illustration in the art, and will not be repeated herein.

FIG. 6E shows the third conductive pattern layer LY3, and the third conductive pattern layer LY3 includes the first wire L1, the third wire L3 (a portion of the first power line 311), the fourth wire L4 (a portion of the first power line 311), a second portion DL12 of the data line (a portion of the data line 313), a first connecting electrode 31a, a second connecting electrode 31b, a third connecting electrode 31c, and a fourth connecting electrode 31d.

Figure 11:
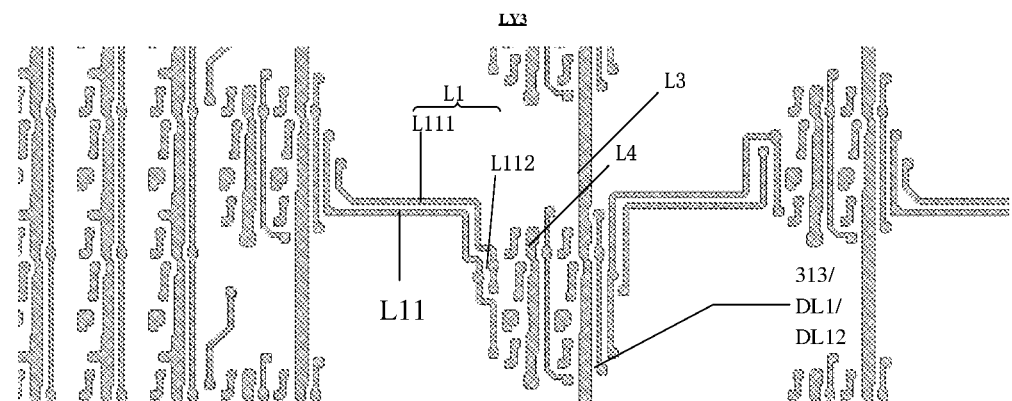
FIG. 11 is a plan view of a third conductive pattern layer of the display panel shown in FIG. 7.
Figure 13:
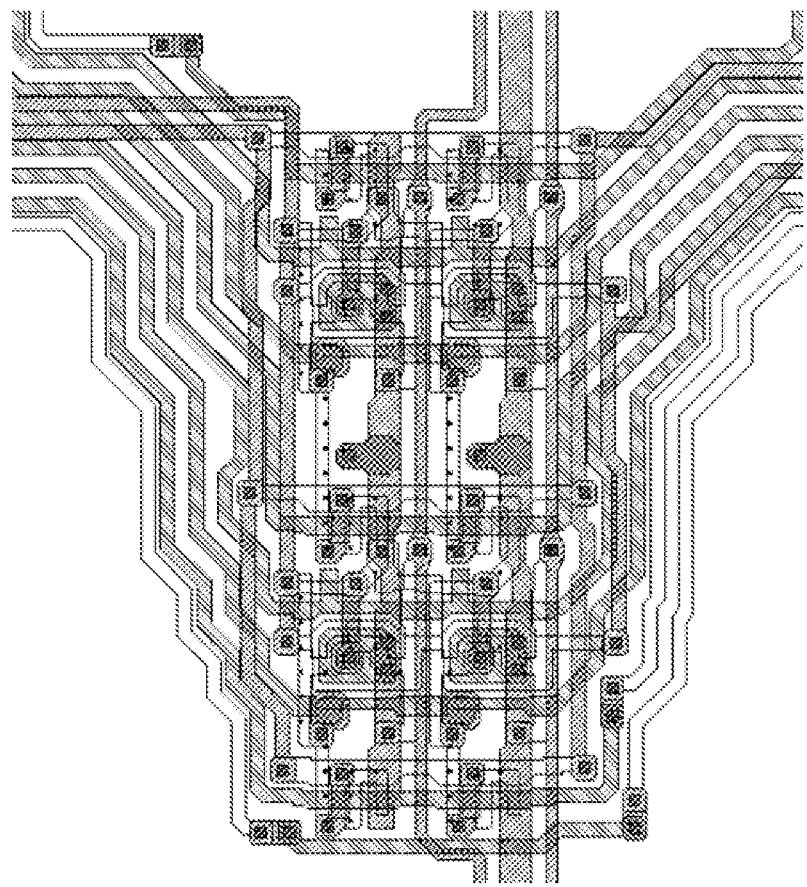
FIG. 13 is an enlarged schematic diagram of a region A21 shown in FIG. 12.
Figure 17:
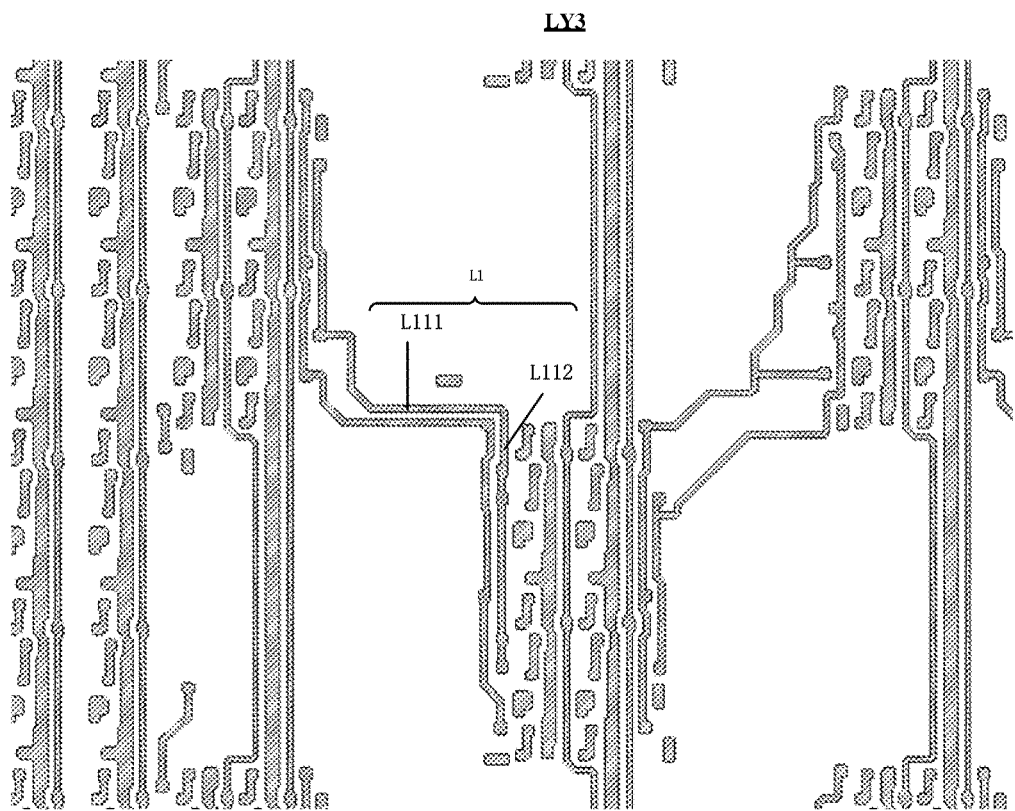
FIG. 17 is a plan view of a third conductive pattern layer of the display panel shown in FIG. 12.

For example, as shown in FIG. 6E, at least one of a plurality of first wires L1 includes a first sub-wire L111 extending along the first direction D1 and a second sub-wire L112 extending along the second direction D2, and the second sub-wire L112 is electrically connected with at least one of a plurality of second wires L2. For example, as shown in FIG. 11, the second sub-wire L112 is electrically connected with the corresponding row of second wire L2 in the adjacent pixel islands. For example, as shown in FIG. 13 and FIG. 17, the second sub-wire L112 is electrically connected with two second wires L2 in one pixel island and two second wires L2 in the pixel island adjacent to the one pixel island. The embodiments of the present disclosure do not make any limit thereto.

For example, the second sub-wire L112 is connected with the block BK0 by a through hole passing through the interlayer insulating layer, and is connected with the second wire L2 by a through hole passing through the interlayer insulating layer.

FIG. 6F is a diagram of a laminated structure of FIG. 6B to FIG. 6E. With reference to FIG. 6B to FIG. 8A, the data line 313 is electrically connected with the first electrode T21 of the data writing transistor T2 by a through hole, the first power line 311 is electrically connected with the first electrode T41 of the first light-emitting control transistor T4 by a through hole, the first power line 311 is electrically connected with the second electrode C12 of the storage capacitor C1 by a through hole, and the first power line 311 is electrically connected with a conductive block BK1 by a through hole. An end of a first connecting electrode 31a is electrically connected with the first initialization signal line 211 by a through hole, and another end of the first connecting electrode 31a is connected with the first electrode T61 of the first reset transistor T6 by a through hole, so that the first electrode T61 of the first reset transistor T6 is electrically connected with the first initialization signal line 211. An end of a second connecting electrode 31b is electrically connected with the second electrode T62 of the first reset transistor T6 by a through hole, and another end of the second connecting electrode 31b is electrically connected with the gate electrode T10 of the driving transistor T1 (i.e., the first electrode C11 of the storage capacitor C1) by a through hole, so that the second electrode T62 of the first reset transistor T6 is electrically connected with the gate electrode T10 of the driving transistor T1 (i.e., the first electrode C11 of the storage capacitor C1). An end of a third connecting electrode 31c is electrically connected with the second initialization signal line 212 by a through hole, and another end of the third connecting electrode 31c is connected with the first electrode T71 of the second reset transistor T7 by a through hole, so that the first electrode T71 of the second reset transistor T7 is electrically connected with the second initialization signal line 212. A fourth connecting electrode 31d is electrically connected with the second electrode T52 of the second light-emitting control transistor T5 by a through hole. The fourth connecting electrode 31d may be used for being electrically connected with the pixel electrode E1 (with reference to FIG. 6A) of the light-emitting element 20 formed later. For example, the positional relationship of the first connecting electrode 31a and the third connecting electrode 31c may refer to positions in FIG. 6E, and for clarity and brevity, is not shown in FIG. 6F.

It should be illustrated that the transistors adopted in some embodiments of the present disclosure all may be thin film transistors, or field effect transistors, or other switching members with the same characteristics. The source electrode and the drain electrode of the transistor adopted herein may be symmetric in structure, so the source electrode and the drain electrode of the transistor structurally may have no difference. In one embodiment of the present disclosure, in order to distinguish two electrodes of the transistor except for the gate electrode, it is directly described that one electrode is the first electrode, and the other electrode is the second electrode, and thus, the first electrodes and the second electrodes of all or part of transistors in the embodiments of the present disclosure may be exchanged as required. For example, according to the embodiments of the present disclosure, the first electrode of the transistor may be the source electrode, while the second electrode may be the drain electrode; or, the first electrode of the transistor is the drain electrode, while the second electrode is the source electrode.

In addition, the transistors may be classified into N-type and P-type transistors according to the characteristics of the transistors. The embodiments of the present disclosure are illustrated by taking a case that all the transistors adopt the P-type transistors as an example. Based on the description and instruction of the present disclosure on this implementation mode, those ordinary skilled in the art, without any creative work, could easily think of a case that at least a portion of transistors in the pixel circuit according to the embodiments of the present disclosure adopt the N-type transistors, i.e., an N-type transistor or N-type transistor and P-type transistor combined implementation mode is adopted, and thus, these implementation modes also fall within the scope of protection of the present disclosure.

FIG. 6A to FIG. 6F illustrate by taking the 7T1C pixel circuit as an example, and the embodiments of the present disclosure include, but are not limited to it. It should be noted that the embodiments of the present disclosure do not make any limit to the number of the thin film transistors and the number of the capacitors included in the pixel circuit. For example, in some additional embodiments, the pixel circuit of the display panel may also be of a structure including other numbers of transistors, such as a 7T2C structure, a 6T1C structure, a 6T2C structure, or a 9T3C structure, which is not limited by the embodiments of the present disclosure.

FIG. 23 is the cross-sectional schematic diagram of a pixel circuit of the display panel provided by some embodiment of the present disclosure. For example, as shown in FIG. 23, the display panel includes a thin film transistor 50 and a storage capacitor C1. The thin film transistor 50 includes an active layer ATL1 located on the base substrate BS, a first gate insulating layer GI1 located on a side of the active layer ATL1 away from the base substrate BS, and a gate electrode GE located on a side of the first gate insulating layer GI1, which is away from the base substrate BS. The display panel further includes a second gate insulating layer GI2 located on a side of the gate electrode GE, which is away from the base substrate BS, an interlayer insulating layer ILD located on a side of the second gate insulating layer GI2, which is away from the base substrate BS, and a source electrode or drain electrode CNE1 located on a side of the interlayer insulating layer ILD, which is away from the base substrate BS. For example, when the thin film transistor 50 is implemented as the N-type transistor, CNE1 represents the source electrode of the thin film transistor 50 and CNE2 represents the drain electrode of the thin film transistor 50; and when the thin film transistor 50 is implemented as the P-type transistor, CNE1 represents the drain electrode of the thin film transistor 50 and CNE2 represents the source electrode of the thin film transistor 50. The active layer ATL1 includes a channel CN11 and a first electrode ET1 and a second electrode ET2 respectively located on both sides of the channel CN11, and the connecting electrode CNE1 is connected with the second electrode ET2 by a through hole passing through the first gate insulating layer GIL the second gate insulating layer GI2, and the interlayer insulating layer ILD. The storage capacitor C1 includes the first electrode C11 and the second electrode C12, the first electrode C11 and the gate electrode GE are located in the same layer and both are located in the first conductive pattern layer LY1, and the second electrode C12 is located between the second gate insulating layer GI2 and the interlayer insulating layer ILD and located in the second conductive pattern layer LY2. One of the first electrode ET1 and the second electrode ET2 is a source electrode, and the other one of the first electrode ET1 and the second electrode ET2 is a drain electrode. The connecting electrode CNE1 is located in the third conductive pattern layer LY3. The display panel further includes a passivation layer PVX and a planarization layer PLN. For example, the source electrode or drain electrode CNE1 is a first portion of the fourth connecting electrode 31d shown in FIG. 6E or FIG. 6F, and the thin film transistor 50 may be the second light-emitting control transistor T5.

As shown in FIG. 23, the display panel further includes the light-emitting element EMC, the light-emitting element EMC includes the pixel electrode E1, a light-emitting functional layer EML, and the common electrode E2, and the pixel electrode E1 is connected with the connecting electrode CNE1 by a through hole penetrating through the passivation layer PVX and the planarization layer PLN. The display panel further includes an encapsulation layer CPS, and the encapsulation layer CPS includes a first encapsulation layer CPS1, a second encapsulation layer CPS2, and a third encapsulation layer CPS3. For example, the first encapsulation layer CPS1 and the third encapsulation layer CPS3 are inorganic material layers, and the second encapsulation layer CPS2 is an organic material layer. For example, the pixel electrode E1 is an anode, the common electrode E2 is a cathode, but the present disclosure is not limited thereto.

For example, the light-emitting element EMC includes an Organic Light-Emitting Diode (OLED). The light-emitting functional layer is located between the common electrode E2 and the pixel electrode E1. The light-emitting functional layer EML at least includes a light-emitting layer, and may further include at least one of a hole transport layer, a hole injection layer, an electron transport layer, and an electron injection layer.

As shown in FIG. 23, the display panel further includes a pixel definition layer PDL and a spacer PS. The pixel definition layer PDL has an opening, the opening is configured to define a light-emitting area (a light emergent region, an effective light-emitting area) of the pixel unit, and the spacer PS is configured to support a fine metal mask when the light-emitting functional layer EML is formed. FIG. 23 shows that the spacers PS are arranged on both opposite sides of the light-emitting element, but the present disclosure is not limited thereto.

For example, the data line is configured to input the data signal to the pixel unit, and the first power line is configured to input the first voltage signal to the driving transistor. The second power line is configured to input the second voltage signal to the sub-pixel. The first voltage signal is a constant voltage, the second voltage signal is a constant voltage, for example, the first voltage signal is a positive voltage, the second voltage signal is a negative voltage, but the present disclosure is not limited thereto. For example, in some embodiment, the first voltage signal is the positive voltage, and the second power line is grounded.

With reference to FIG. 23, in the embodiment of the present disclosure, a first insulating layer ISL1 includes at least one of the first gate insulating layer Gil, the second gate insulating layer GI2, and the interlayer insulating layer ILD, and a second insulating layer ISL2 includes the planarization layer PLN.

For example, the first gate insulating layer Gil, the second gate insulating layer GI2, the interlayer insulating layer ILD, the passivation layer PVX, the planarization layer PLN, the pixel definition layer PDL, and the spacer PS are all made of an insulating material. For example, materials of the first gate insulating layer GI1, the second gate insulating layer GI2, the interlayer insulating layer ILD, and the passivation layer PVX include at least one of SiOx and SiNx, but are not limited thereto. For example, the planarization layer PLN, the pixel definition layer PDL, and the spacer PS may be made of an organic insulating material, e.g., resin, but the present disclosure is not limited thereto.

Figure 8A:
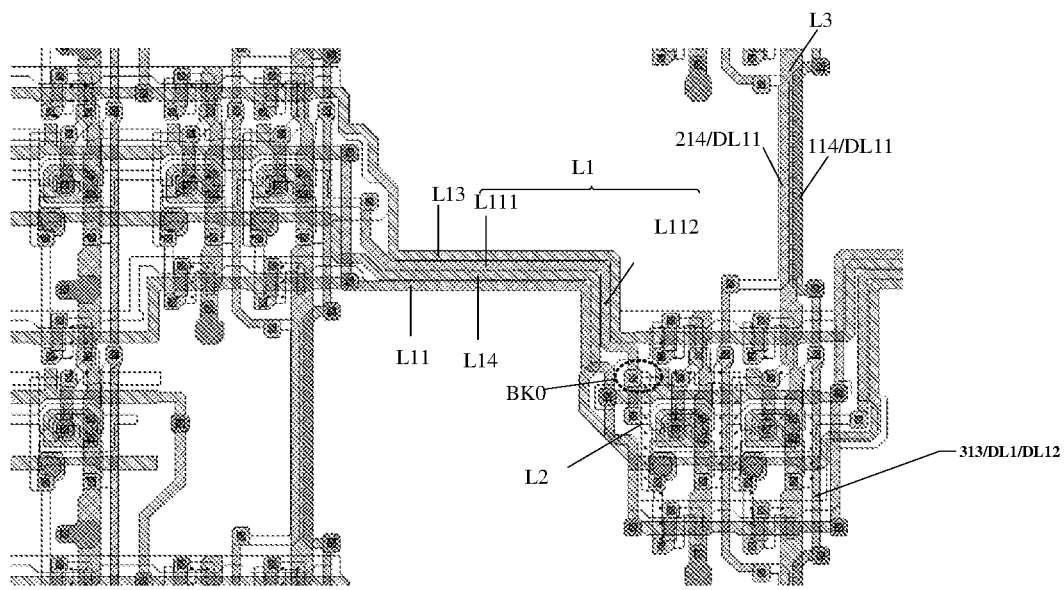
FIG. 8A is an enlarged schematic diagram of a region A11 shown in FIG. 7.
Figure 8B:
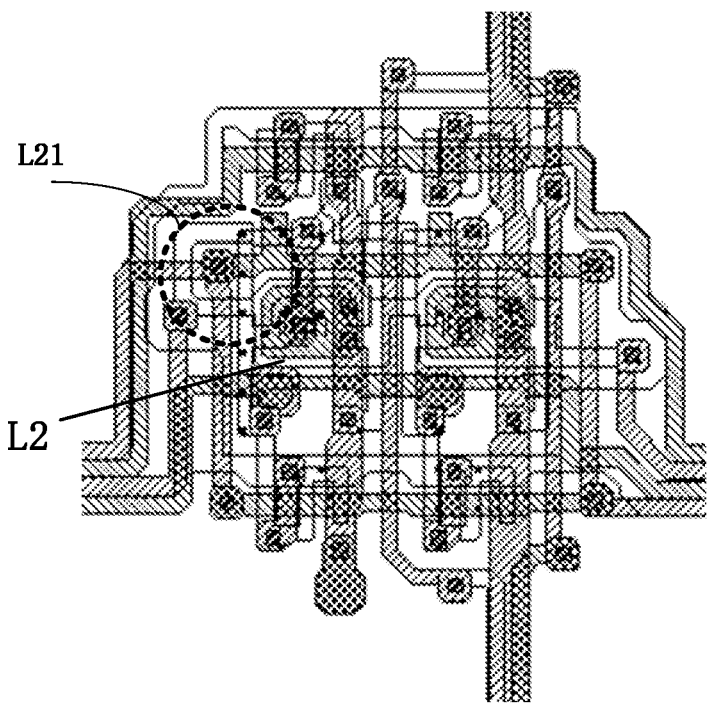
FIG. 8B is an enlarged schematic diagram of a region A12 shown in FIG. 7.
Figure 10:
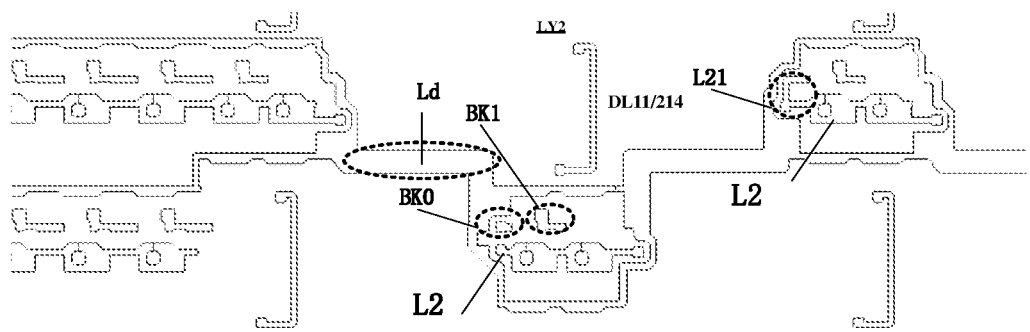
FIG. 10 is a plan view of a second conductive pattern layer of the display panel shown in FIG. 7.

With reference to FIG. 6F, the threshold compensation transistor T3 includes a first active part CN1 and a second active part CN2, and the first active part CN1 and the second active part CN2 are connected through a conductive part CP. With reference to FIG. 8B and FIG. 10, the second wire L2 further includes a connecting arm L21. The threshold compensation transistor T3 is a double-gate transistor, when the threshold compensation transistor T3 is turned off, the conductive part CP is in a floating state and is liable to jump due to influence of the voltage of a surrounding line, and the voltage jumping of the conductive part CP may influence the leakage current of the threshold compensation transistor T3 so as to influence the light-emitting brightness of the pixel unit, and thus, the voltage of the conductive part CP needs to be kept stable. A block may be designed to form the capacitor with the conductive part CP, and the block may have a constant voltage signal, so that the voltage of the conductive part CP in the floating state is kept stable. The block BK0 and the block BK1 mentioned in the embodiments of the present disclosure and the connecting arm mentioned later all take an effect of stabilizing the voltage of the conductive part CP.

Figure 8C:
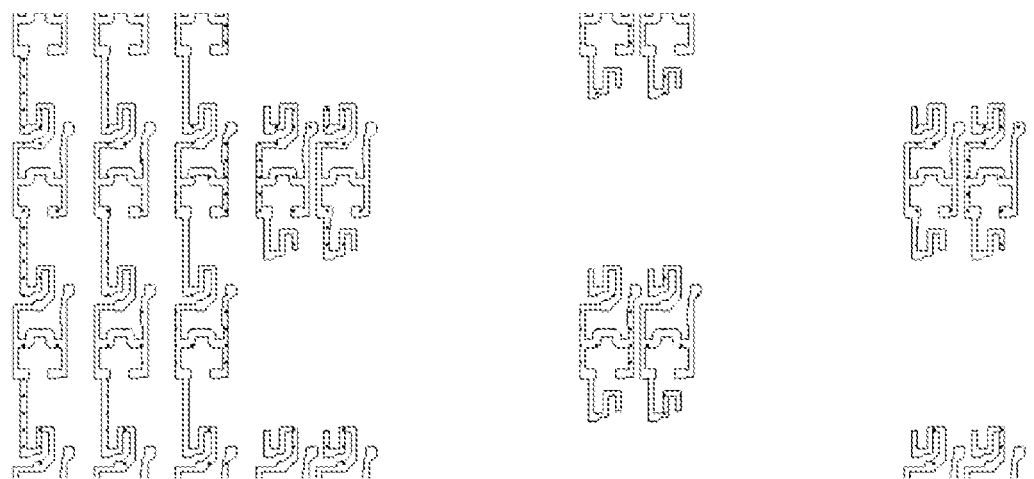
FIG. 8C is a plan view of a semiconductor pattern of the display panel shown in FIG. 7.
Figure 9:
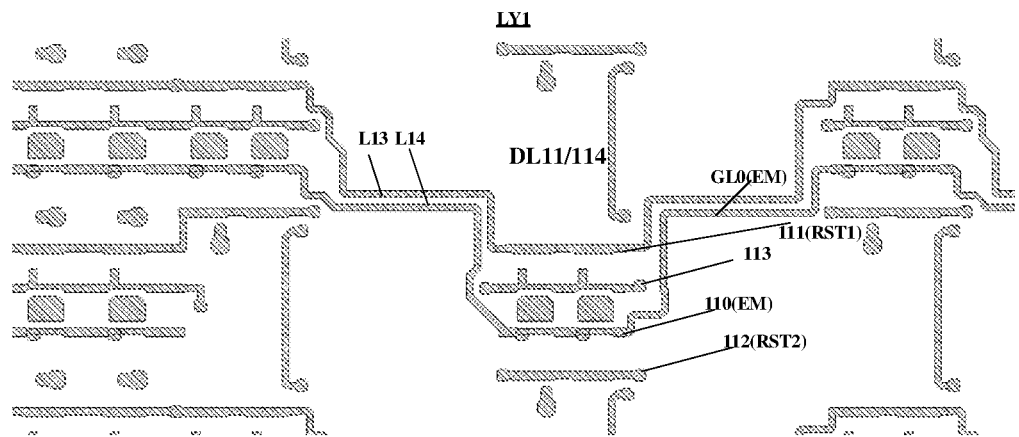
FIG. 9 is a plan view of a first conductive pattern layer of the display panel shown in FIG. 7.

FIG. 7 is a schematic diagram of a display panel provided by at least one embodiment of the present disclosure; FIG. 8A is an enlarged schematic diagram of a region A11 shown in FIG. 7; FIG. 8B is an enlarged schematic diagram of a region A12 shown in FIG. 7; FIG. 8C is a plan view of the semiconductor pattern of the display panel shown in FIG. 7; FIG. 9 is a plan view of the first conductive pattern layer of the display panel shown in FIG. 7; FIG. 10 is a plan view of the second conductive pattern layer of the display panel shown in FIG. 7; and FIG. 11 is a plan view of the third conductive pattern layer of the display panel shown in FIG. 7.

For example, as shown in FIG. 7, at least two sub-pixels include the first sub-pixel 101 and the second sub-pixel 102, and the first sub-pixel 101 and the second sub-pixel 102 are arranged along the first direction D1. For example, as shown in FIG. 8A, at least one of a plurality of second wires L2 is electrically connected with the first sub-pixel 101 and the second sub-pixel 102, and the second sub-wire L112 and the plurality of second wires L2 are located in different layers.

For example, as shown in FIG. 6A, the sub-pixel P0 further includes the light-emitting element 20, the pixel circuit includes a first transistor (e.g., the threshold compensation transistor T3) and a second transistor (e.g., the second light-emitting control transistor T5 shown in FIG. 6A), the first transistor T3 is connected with the second transistor T5, and the second transistor T5 is connected with the light-emitting element 20. For example, as shown in FIG. 6F, the first transistor T3 includes the first active part CN1 and the second active part CN2, and the first active part CN1 and the second active part CN2 are connected through the conductive part CP.

For example, as shown in FIG. 8B and FIG. 10, the second wire L2 further includes the connecting arm L21, the connecting arm L21 and the conductive part CP of one sub-pixel in the pixel group, which overlaps with the second wire L2, are spaced from each other in a third direction D3 and partially overlap in the third direction D3 (with reference to FIG. 24), and the third direction D3 is perpendicular to the first direction D1 and perpendicular to the second direction D2.

For example, as shown in FIG. 8B and FIG. 10, the shape of the connecting arm L21 includes a C shape. It should be illustrated that the connecting arm L21 may be substantially of a C shape, and certainly, the connecting arm L21 may also adopt other shapes, as long as the connecting arm L21 can take the effect of stabilizing the threshold compensation transistor T3.

With reference to FIG. 24, the connecting arm L21 partially overlaps with the conductive part CP of the threshold compensation transistor T3 to form a capacitor C0, and the first gate insulating layer GI1 and the second gate insulating layer GI2 are arranged between the connecting arm L21 and the conductive part CP. FIG. 24 further shows the second active part CN2. The capacitor C0 may be called as a stabilization capacitor, and the connecting arm L21 and the conductive part CP are two polar plates of the capacitor C0. As shown in FIG. 24, a gate electrode GE2 overlaps with the second active part CN2 in a direction perpendicular to the base substrate BS. The gate electrode GE2 is a gate electrode of the threshold compensation transistor T3. As shown in FIG. 24, a portion of the second connecting electrode 31b (as shown in FIG. 6E) is used as the second electrode T32 (e.g., the drain electrode) of the threshold compensation transistor T3.

For example, the third direction D3 is perpendicular to the first direction D1 and perpendicular to the second direction D2, the third direction D3 is a direction perpendicular to the base substrate BS, and the first gate insulating layer GI1 and the second gate insulating layer GI2 are arranged between the connecting arm L21 and the conductive part CP. For example, the first direction D1 and the second direction D2 are directions in parallel to a main surface of the base substrate BS, and the third direction D3 is a direction perpendicular to the main surface of the base substrate BS. Various elements are produced on the main surface of the base substrate BS.

With reference to FIG. 6F, FIG. 8A, and FIG. 24, the block BK0 and the conductive part of one sub-pixel in the pixel island, which overlaps with the first wire L1, are spaced from each other in the third direction D3 and partially overlap in the third direction D3. With reference to FIG. 6F, FIG. 8A, and FIG. 24, the block BK0 and the conductive part CP of one sub-pixel (the sub-pixel on the lower right corner in FIG. 8A) in the pixel island, which overlaps with the first wire L1, are spaced from each other in the third direction D3 and partially overlap in the third direction D3.

For example, with reference to FIG. 6A, FIG. 6F, FIG. 8B, and FIG. 24, the second wire L2 further includes the connecting arm L21, the connecting arm L21 and the conductive part CP of one sub-pixel (the sub-pixel located on the upper right corner in FIG. 7, i.e., the sub-pixel in FIG. 8B) in the pixel island, which overlaps with the second wire L2, are spaced from each other in the third direction D3 and partially overlap in the third direction D3. For example, the first transistor and the second transistor respectively are the threshold compensation transistor T3 in the pixel circuit 10 and the light-emitting control transistor connected with the light-emitting element. For example, the light-emitting control transistor connected with the light-emitting element is the second light-emitting control transistor T5 as above-mentioned. Certain, in other embodiments of the present disclosure, the block or the connecting arm forming the capacitor with the conductive part CP in the first transistor in the pixel island may also adopt other forms, which is not limited herein.

For example, as shown in FIG. 6D, the initialization signal line 20 includes a plurality of hollow regions HP, the second wire L2 is located in one hollow region HP and is surrounded by a portion of the initialization signal line, which forms the hollow region HP in a surrounding mode, and the second wire L2 does not overlap with the portion of the initialization signal line, which forms the hollow region in a surrounding mode. Namely, the second wire L2 is completely surrounded by the portion of the initialization signal line, which forms the hollow region HP in a surrounding mode. In the embodiments of the present disclosure, the hollow region HP is a position corresponding to a removed portion of a thin film when the initialization signal line 210 is produced.

For example, with reference to FIG. 8A, the first wire L1 includes the first sub-wire L111 and the second sub-wire L112, the first sub-wire L111 of the first wire L1 is not located in the same layer with the second wire L2, and the second sub-wire L112 of the first wire L1 is not located in the same layer with the second wire L2. With reference to FIG. 8A, FIG. 10, and FIG. 11, the second wire L2 is located in the second conductive pattern layer LY2, and the first wire L1 is located in the third conductive pattern layer LY3.

For example, with reference to FIG. 3, the data line 313 includes the first data line DL1, and the first data line DL1 extends to the second display region R2 from the first display region R1. For example, as shown in FIG. 8A, the first portion DL11 of the first data line DL1 partially overlaps with an orthogonal projection of the third wire L3 on the base substrate BS. Such setting mode is beneficial for reducing the wiring area and improving the light transmittance.

For example, with reference to FIG. 6C, FIG. 6D, FIG. 7, and FIG. 8A, the first data line DL1 includes the first portion DL11 and the second portion DL12, the first portion DL11 of the first data line DL1 partially overlaps with the third wire L3, the second portion DL12 of the first data line DL1 does not overlap with the third wire L4, and the first portion DL11 of the first data line DL1 and the second portion DL12 of the first data line DL1 are respectively located in different layers. For example, the first portion DL11 (a wire 214) of the first data line DL1 on the left side in FIG. 8A is located in the second conductive pattern layer, and the second portion DL12 of the first data line DL1 on the left side is located in the third conductive pattern layer, the first portion DL11 (a wire 114) of the first data line DL1 on the right side in FIG. 8A is located in the first conductive pattern layer shown in FIG. 9, and the second portion DL12 of the first data line DL1 on the right side in FIG. 8A is located in the third conductive pattern layer shown in FIG. 11. For example, with reference to FIG. 3, FIG. 19, and FIG. 23, the first portion DL11 of the first data line DL1 is located between the adjacent pixel islands P1.

For example, with reference to FIG. 3, two first data lines DL1 are provided, and two first data lines DL1 are respectively connected with two adjacent columns of sub-pixels. For example, as shown in FIG. 8A, the first portions DL11 of two first data lines partially overlap with the orthogonal projection of the same third wire L3 on the base substrate BS. Such setting mode enables the data line between the pixel islands in the two adjacent columns of sub-pixels to be hidden under the third conductor so as to reduce the wiring area and improve the light transmittance.

For example, the first wire L1 and the second wire L2 are located in different layers and connected by a through hole passing through the insulating layer. With reference to FIG. 8A and FIG. 11, the first wire L1 is located in the third conductive pattern layer LY3, and the second wire is located in the second conductive pattern layer LY2. With reference to FIG. 23 and FIG. 24, an interlayer dielectric layer ILD is arranged between the second conductive pattern layer LY2 and the third conductive pattern layer LY3, i.e., the second sub-wire L112 of the first wire L2 and the second wire L2 are connected by a through hole penetrating through the interlayer dielectric layer ILD.

For example, with reference to FIG. 11, the first wire and the third wire L3 are located in the same layer and both located in the third conductive pattern layer LY3. The fourth wire L4 and the third wire L3 are located in the same layer and both located in the third conductive pattern layer LY3.

For example, a plurality of pixel groups include a plurality of first pixel groups (i.e., the pixel islands) and a plurality of second pixel groups (i.e., the pixel islands) arranged at intervals, and the adjacent first pixel group and second pixel group are connected by a plurality of wires (for example, including a wire L11 connected between the gate lines of the adjacent pixel islands, a wire L13 (i.e., 210) connected between the initialization signal lines of the adjacent pixel islands, a wire L14 connected between the light-emitting control signal lines of the adjacent pixel islands, the first wire L1, and the like).

For example, as shown in FIG. 8A and FIG. 10, the display panel 1 further includes a connecting wire Ld, orthogonal projections of at least two of the plurality of wires between the adjacent first pixel group and second pixel group on the base substrate fall within an orthogonal projection of the connecting wire Ld on the base substrate. For example, in some examples, there are a plurality of gaps between the plurality of wires, an orthogonal projection of at least one of the plurality of gaps on the base substrate at least partially overlaps with the orthogonal projection of the connecting wire Ld on the base substrate, so that gap light leakage between the wires can be prevented.

For example, as shown in FIG. 6A to FIG. 6F, the pixel circuit 10 includes the first reset signal line 111, the second reset signal line 112, the gate line 113, the light-emitting control signal line 110, and the initialization signal line 210, so as to respectively provide a first reset signal, a second reset signal, a gate electrode scanning signal, a light-emitting control signal, and an initialization signal; and the plurality of wires are selected from at least two of the first reset signal line 111, the second reset signal line 112, the gate line 113, the light-emitting control signal line 110, the initialization signal line 210, and the first wire. For example, the first reset signal line 111, the second reset signal line 112, the gate line 113, the light-emitting control signal line 110, the initialization signal line 210, and the second wire of the first pixel group are respectively connected with the second reset signal line 112, the gate line 113, the light-emitting control signal line 110, the initialization signal line 210, and the second wire of the second pixel group through a plurality of wires.

For example, as shown in FIG. 8A and FIG. 10, the orthogonal projection of the connecting wire Ld on the base substrate is at least partially located between the orthogonal projections of the adjacent first pixel group and second pixel group on the substrate, and the connecting wire Ld and the initialization signal line are located in the same layer and integrally formed.

Figure 19:
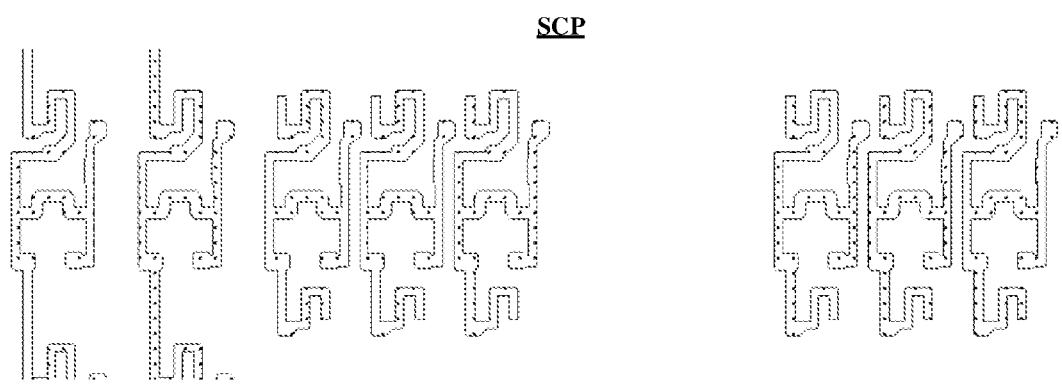
FIG. 19 is a plan view of a semiconductor pattern of the display panel shown in FIG. 18.
Figure 20:
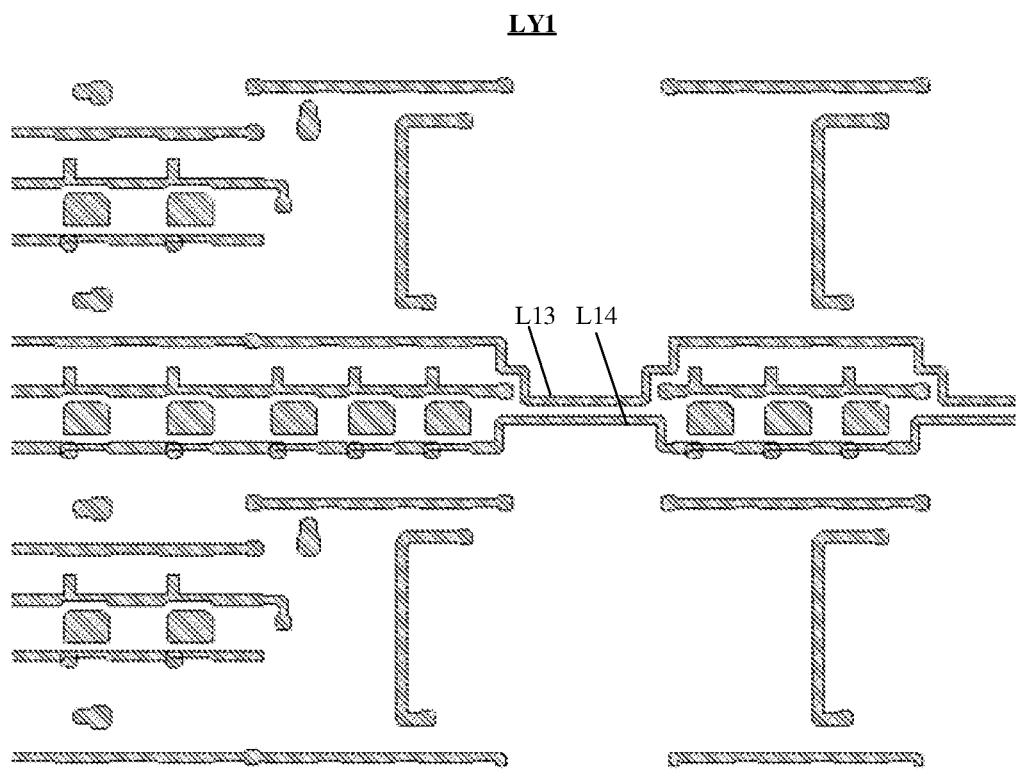
FIG. 20 is a plan view of a first conductive pattern layer of the display panel shown in FIG. 18.
Figure 21:
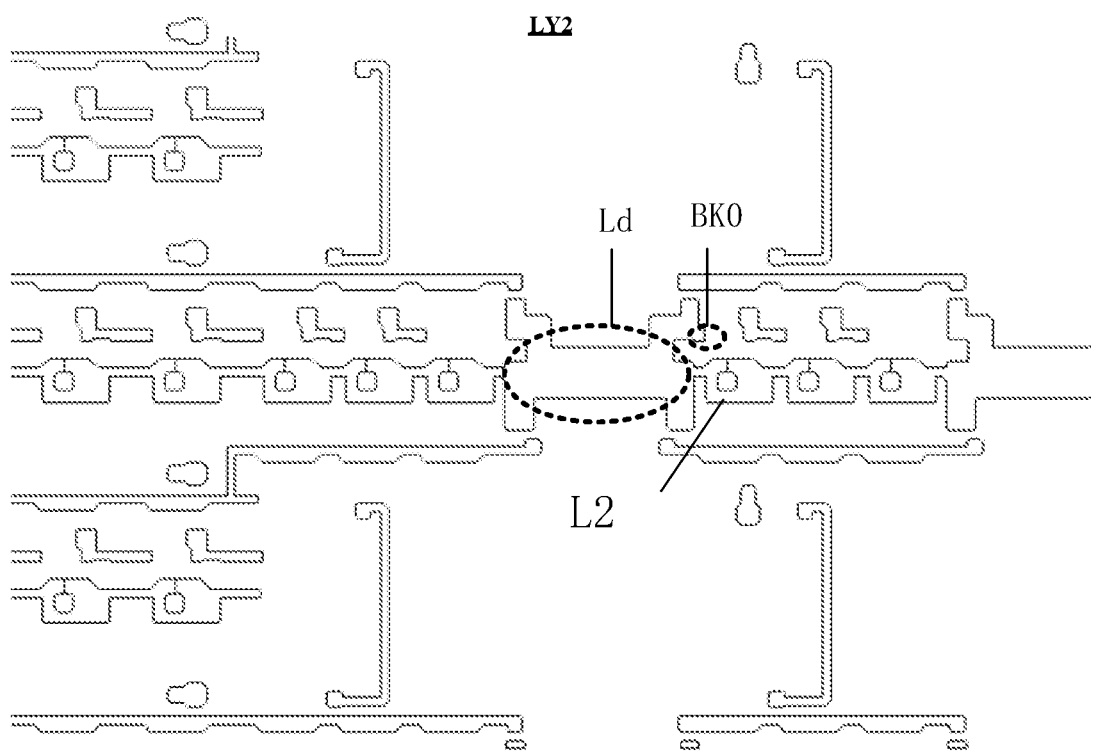
FIG. 21 is a plan view of a second conductive pattern layer of the display panel shown in FIG. 18.
Figure 22:
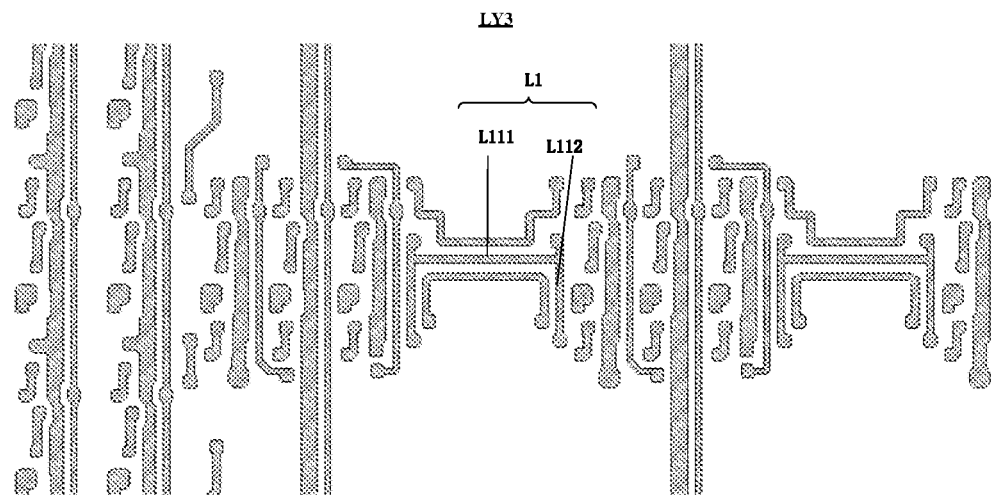
FIG. 22 is a plan view of a third conductive pattern layer of the display panel shown in FIG. 18.

FIG. 18 is a schematic diagram of a display panel in which one pixel island includes three sub-pixels, as provided by at least one embodiment of the present disclosure. For example, one pixel island includes the first sub-pixel 101, the second sub-pixel 102, and the third sub-pixel 103. FIG. 19 is a plan view of a semiconductor pattern of the display panel shown in FIG. 18; FIG. 20 is a plan view of the first conductive pattern layer of the display panel shown in FIG. 18; FIG. 21 is a plan view of the second conductive pattern layer of the display panel shown in FIG. 18; and FIG. 22 is a plan view of the third conductive pattern layer of the display panel shown in FIG. 18.

For example, the display panel shown in FIG. 18 and the display panel shown in FIG. 7 are basically the same in connecting structure, and the difference is that: the adjacent pixel islands shown in FIG. 18 are located in the same row, and the adjacent pixel islands shown in FIG. 7 are arranged in a staggered mode. Description related to FIG. 18 may refer to related description of FIG. 7 to FIG. 11 and is not repeated herein.

For example, as shown in FIG. 18 and FIG. 21, the connecting wire Ld and the second wire L2 are located in the same layer and integrally formed. It should be noted that the connecting wire Ld may also be located in the same layer with the first wire L1 and integrally formed with the first wire L1, which is not limited by the embodiments of the present disclosure.

For example, in this embodiment, as shown in FIG. 21, the connecting wire Ld is provided with the block BK0, and the block BK0 and the connecting wire Ld are arranged in the same layer and integrally formed. The block and the conductive part of one pixel unit in the pixel group, which overlaps with the first wire L1, are spaced from each other in the third direction D3 and partially overlap in the third direction D3, so that stability of the threshold compensation transistor T3 can be ensured. The specific description may refer to the illustration above, and is not repeated herein.

Figure 14:
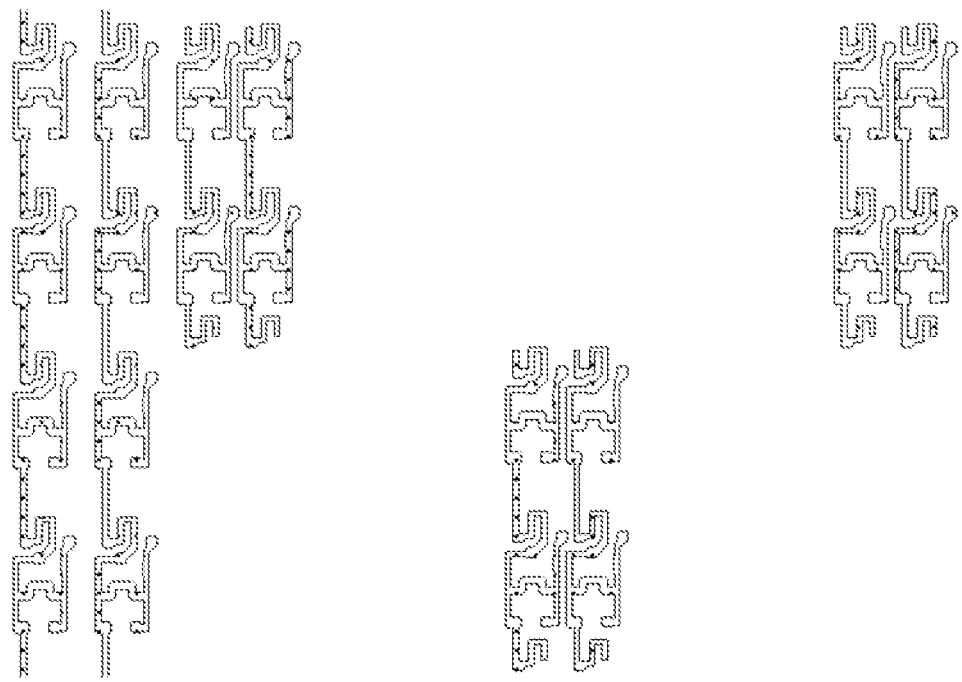
FIG. 14 is a plan view of a semiconductor pattern of the display panel shown in FIG. 12.
Figure 15:
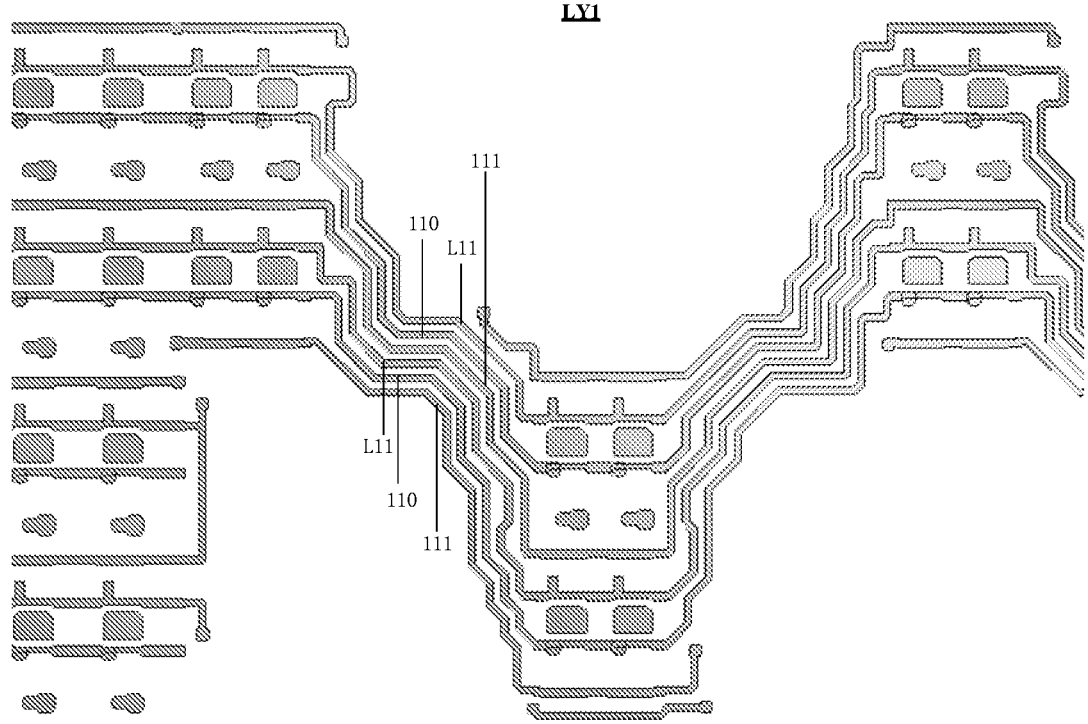
FIG. 15 is a plan view of a first conductive pattern layer of the display panel shown in FIG. 12.
Figure 16:
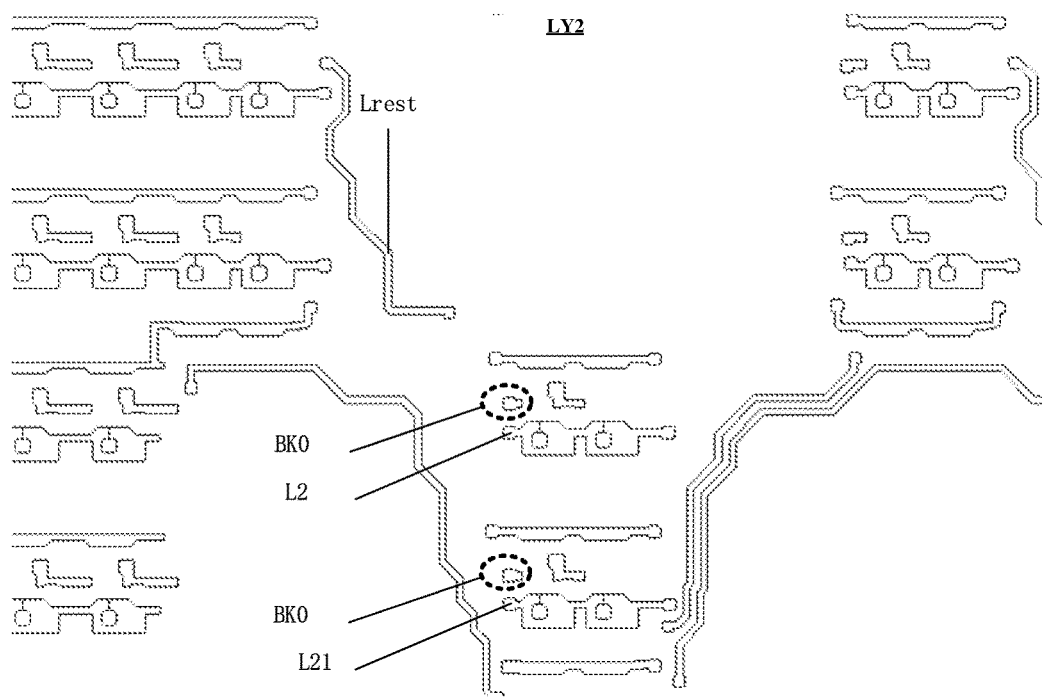
FIG. 16 is a plan view of a second conductive pattern layer of the display panel shown in FIG. 12.

FIG. 12 is a schematic diagram of a display panel in which one pixel island includes four sub-pixels provided by at least one embodiment of the present disclosure. for example, one pixel island includes the first sub-pixel 101, the second sub-pixel 102, the third sub-pixel 103, and the fourth sub-pixel 104. FIG. 13 is an enlarged schematic diagram of a region A21 shown in FIG. 12; FIG. 14 is a plan view of the semiconductor pattern of the display panel shown in FIG. 12; FIG. 15 is a plan view of the first conductive pattern layer of the display panel shown in FIG. 12; FIG. 16 is a plan view of the second conductive pattern layer of the display panel shown in FIG. 12; FIG. 17 is a plan view of the third conductive pattern layer of the display panel shown in FIG. 12.

For example, in some embodiments of the present disclosure, as shown in FIG. 12, at least two sub-pixels further includes the third sub-pixel 103 and the fourth sub-pixel 104, the third sub-pixel 103 and the fourth sub-pixel 104 are arranged along the first direction D1 and located on a side of the first sub-pixel 101 and on a side of the second sub-pixel 102 along the second direction D2, the third sub-pixel 103 and the fourth sub-pixel 104 are electrically connected with another (e.g., the second wire L21 located at the lower portion of the layout, as shown in FIG. 16) of a plurality of second wires L2, and the second sub-wire L112 is electrically connected with at least one of a plurality of second wires, for example, electrically connected with the second wire L2 located at a first row of pixels (i.e., the first sub-pixel 101 and the second sub-pixel 102) and/or the second wire L21 located at a second row of pixels (i.e., the third sub-pixel 103 and the fourth sub-pixel 104).

For example, the display panel shown in FIG. 12 is basically the same with the display panel shown in FIG. 7, and the difference is that: the wires connecting two adjacent pixel groups are located in different layers. Particularly, for example, as shown in FIG. 15, the wire L11 connecting the gate lines of two adjacent pixel islands is located in the first conductive pattern layer LY2, but in FIG. 7, the wire L11 is located in the third conductive pattern layer LY3; the initialization signal line 111 extends to the first display region R1 from the second display region R2 in the first conductive pattern layer; and as shown in FIG. 16, the initialization signal line 111 may also be connected by a wire Lrest located in the second conductive pattern layer.

For example, as shown in FIG. 16 and FIG. 10, the second sub-wire L112 is provided with the block BK0, and the block BK0 and the second sub-wire L112 are located in different layers and connected by a through hole. For example, with reference to FIG. 24 at the same time, the block BK0 is located in the second conductive pattern layer, and the second sub-wire L112 is located in the third conductive pattern layer LY3 shown in FIG. 17 and FIG. 11, and thus, in this embodiment, the block BK0 is connected with the second sub-wire L112 by a through hole passing through the insulating layer so as to ensure stability of the threshold compensation transistor T3.

It should be noted that the rest of structures (e.g., the block BK0, the first wire L1, and the like) of the display panel may refer to illustration in FIG. 7 to FIG. 11, and are not repeated herein.

At least one embodiment of the present disclosure further provides a display device, including any one of the above-mentioned display panels. For example, the display device may be a display member such as an OLED display and the like, or any product or member including these display members and having the display function, such as a telephone, a digital camera, a mobile phone, a watch, a tablet personal computer, a notebook computer, a navigator, and the like.

Figure 25:
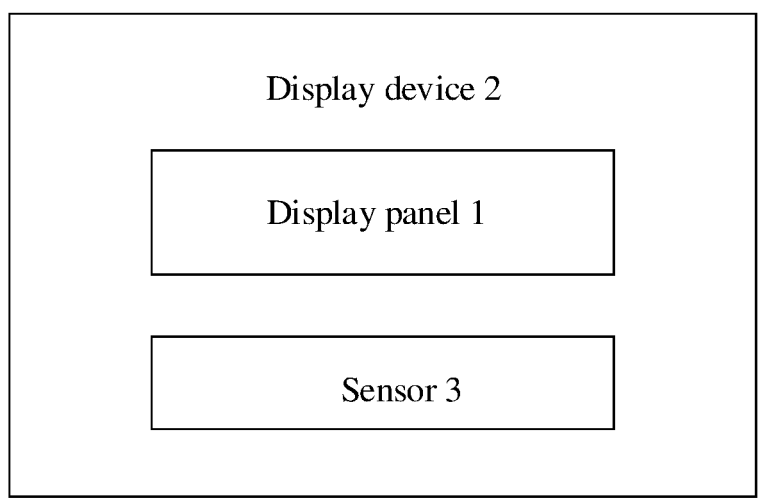
FIG. 25 is a schematic diagram of a display device provided by at least one embodiment of the present disclosure.

FIG. 25 is a schematic diagram of a display device provided by at least one embodiment of the present disclosure. As shown in FIG. 25, the display device 2 includes a display panel 1 and a sensor 3. For example, the sensor 3 is arranged on a side of the display panel 1.

For example, as shown in FIG. 1A to FIG. 1C, the sensor 3 is arranged on a second side of the display panel 1, and the sensor 3 is configured to receive light from a first side of the display panel. For example, the first side of the display panel 1 is used for display, and a first display region R1 allows the light from the first side of the display panel to be at least partially transmitted to the second side of the display panel.

For example, an orthogonal projection of the sensor 3 on a base substrate at least partially overlaps with the first display region R1.

It should be noted that, for the sake of clarity and conciseness, the embodiments of the present disclosure do not provide all the constituent units of the display device. In order to realize the base function of the display device, those skilled in the art may provide or set other structures not shown according to specific needs, which are not limited by the embodiments of the present disclosure.

Regarding to the technical effect of the display device 2 provided by the above-mentioned embodiments, reference may be made to the technical effect of the display substrate 1 provided by the embodiments of the present disclosure, which will not be repeated here.

The following statements should be noted:

(1) Unless otherwise defined, the same reference number is denoted as the same meaning in the embodiments of the accompanying drawings of the present disclosure.

(2) The accompanying drawings involve only the structure(s) in connection with the embodiment(s) of the present disclosure, and other structure(s) may be referred to common design(s).

(3) For the purpose of clarity, in accompanying drawings for illustrating the embodiment(s) of the present disclosure, the thickness of a layer or a region may be enlarged. it should understood that, in the case in which a element such as a layer, film, region, substrate or the like is referred to be "on" or "under" another element, it may be directly on or under the another element or a element is interposed therebetween.

(4) In case of no conflict, features in one embodiment or in different embodiments may be combined to obtain a new embodiment.

The above disclosure are only specific embodiments of the present disclosure, but the protection scope of the present disclosure is not limited to this. Changes or substitutions which can be easily thought of by any of those skilled in the art within the technical scope disclosed by the present disclosure should be included within the protection scope of the present disclosure. Therefore, the protection scope of the present disclosure should be based on the protection scope of the claims.

The invention claimed is:

1. A display panel, comprising:
a first display region;
a second display region, at least located on a side of the first display region;
a plurality of sub-pixels, located in the first display region and the second display region, a density of the sub-pixels in the first display region being less than a density of the sub-pixels in the second display region, and each of the plurality of the sub-pixels comprising a pixel circuit;
a plurality of pixel groups, located in the first display region, at least one of the plurality of pixel groups comprising at least two sub-pixels; and
a first power line, configured to provide a first voltage signal to the pixel circuit,
wherein the first power line comprises a plurality of first wires and a plurality of second wires, the plurality of first wires extend to the first display region from the second display region and are electrically connected with the plurality of pixel groups, the plurality of second wires are located in the first display region and located between the adjacent first wires, the plurality of second wires extend along a first direction, the adjacent second wires are spaced from each other along the first direction, and the plurality of second wires are electrically connected with the plurality of pixel groups,
wherein at least one of the plurality of first wires comprises a first sub-wire extending along the first direction and a second sub-wire extending along a second direction, the first direction intersects with the second direction, and the second sub-wire is electrically connected with at least one of the plurality of second wires,
wherein the at least two sub-pixels comprise a first sub-pixel and a second sub-pixel, the first sub-pixel and the second sub-pixel are arranged along the first direction, at least one of the plurality of second wires is electrically connected with the first sub-pixel and the second sub-pixel, and the second sub-wire and the plurality of second wires are located in different layers,
each of the plurality of the sub-pixels further comprises a light-emitting element, the pixel circuit comprises a first transistor, a second transistor, and a storage capacitor, the first transistor is respectively connected with the second transistor and the storage capacitor, the second transistor is connected with the light-emitting element, the first transistor comprises a first active part and a second active part, and the first active part and the second active part are connected by a conductive part,
each of the plurality of the second wires further comprises a connecting arm, the connecting arm and the conductive part of one sub-pixel overlapping with the second wire in the pixel group are spaced from each other in a third direction and partially overlap in the third direction, and the third direction is perpendicular to the first direction and perpendicular to the second direction.

2. The display panel according to claim 1, wherein the plurality of pixel groups comprise a plurality of first pixel groups and a plurality of second pixel groups arranged at intervals, and the adjacent first pixel group and second pixel group are connected through a plurality of lines.

3. The display panel according to claim 2, further comprising a connecting wire, orthogonal projections of at least two of the plurality of lines between the adjacent first pixel group and second pixel group on a base substrate falling within an orthogonal projection of the connecting wire on the base substrate.

4. The display panel according to claim 3, wherein a plurality of gaps are formed between the plurality of lines, and an orthogonal projection of at least one of the plurality of gaps on the base substrate at least partially overlaps with the orthogonal projection of the connecting wire on the base substrate.

5. The display panel according to claim 2, wherein the pixel circuit comprises a first reset signal line, a second reset signal line, a gate line, a light-emitting control signal line, and an initialization signal line, to respectively provide a first reset signal, a second reset signal, a gate electrode scanning signal, a light-emitting control signal, and an initialization signal to the pixel circuit; and
the plurality of lines are selected from at least two of the first reset signal line, the second reset signal line, the gate line, the light-emitting control signal line, the initialization signal line, and the first wire.

6. The display panel according to claim 3, wherein the connecting wire is provided with a block, and the block and the connecting wire are arranged in the same layer and integrally formed;
the sub-pixel further comprises a light-emitting element, the pixel circuit includes a first transistor, a second transistor, and a storage capacitor, the first transistor is respectively connected with the second transistor and the storage capacitor, the second transistor is connected with the light-emitting element, the first transistor comprises a first active part and a second active part, and the first active part and the second active part are connected through a conductive part; and
the block and the conductive part of one pixel unit overlapping with the first wire in the pixel group are spaced from each other in the third direction and partially overlap in the third direction.

7. The display panel according to claim 5, wherein the orthogonal projection of the connecting wire on the base substrate is at least partially located between orthogonal projections of the adjacent first pixel group and second pixel group on the base substrate.

8. The display panel according to claim 7, wherein a first reset signal line, a second reset signal line, a gate line, a light-emitting control signal line, an initialization signal line, and a second wire of the first pixel group are respectively connected with a first reset signal line, a second reset signal line, a gate line, a light-emitting control signal line, an initialization signal line, and a second wire of the second pixel group through the plurality of lines.

9. The display panel according to claim 8, wherein the connecting wire and the second wire are located in the same layer and integrally formed; or the connecting wire and the initialization signal line are located in the same layer and integrally formed; or the connecting wire and the first wire are located in the same layer.

10. The display panel according to claim 1, wherein the at least two sub-pixels further comprise a third sub-pixel and a fourth sub-pixel, the third sub-pixel and the fourth sub-pixel are arranged along the first direction and located on a side of the first sub-pixel and the second sub-pixel along the second direction, the third sub-pixel and the fourth sub-pixel are electrically connected with another one of the plurality of second wires, and the second sub-wire is electrically connected with at least one of the plurality of second wires.

11. The display panel according to claim 1, wherein the second sub-wire is provided with a block, the block and the second sub-wire are located in different layers and connected by a through hole, and
the block and the conductive part of one pixel unit overlapping with the first wire in the pixel group are spaced from each other in the third direction and partially overlap in the third direction.

12. The display panel according to claim 1, wherein the plurality of second wires are sequentially arranged along the first direction, wherein the adjacent second wires are not directly connected.

13. The display panel according to claim 1, wherein the first power line further comprises a third wire and a fourth wire,
the third wire extends along the second direction, the third wire extends to the first display region from the second display region, and the second wire is electrically connected with the third wire; and
the fourth wire extends along the second direction, the second wire is electrically connected with the fourth wire, and a length of the fourth wire in the second direction is less than or equal to a length of the third wire in the second direction.

14. The display panel according to claim 1, comprising a plurality of fourth wires, the plurality of fourth wires being located between the adjacent third wires, the plurality of fourth wires being sequentially arranged along the second direction, and the adjacent fourth wires being spaced from each other in the second direction.

15. The display panel according to claim 2, wherein the first display region comprises a plurality of light-transmitting regions located between adjacent pixel groups of the plurality of pixel groups, wherein the plurality of pixel groups and lines of the plurality of the lines connected with the adjacent pixel groups surround the plurality of light-transmitting regions.

16. A display device, comprising the display panel according to claim 1.

17. The display device according to claim 16, further comprising a sensor, wherein
the sensor is arranged on a side of the display panel, and an orthogonal projection of the sensor on the base substrate at least partially overlaps with the first display region.

* * * * *